United States Patent
Wang et al.

(10) Patent No.: US 12,004,160 B2
(45) Date of Patent: Jun. 4, 2024

(54) RATE MATCHING ON SIDELINK AUTOMATIC GAIN CONTROL

(71) Applicant: QUALCOMM Incorporated, San Diego, CA (US)

(72) Inventors: Xiaojie Wang, Hillsborough, NJ (US); Piyush Gupta, Bridgewater, NJ (US); Junyi Li, Fairless Hills, PA (US)

(73) Assignee: QUALCOMM Incorporated, San Diego, CA (US)

( * ) Notice: Subject to any disclaimer, the term of this patent is extended or adjusted under 35 U.S.C. 154(b) by 253 days.

(21) Appl. No.: 17/459,796

(22) Filed: Aug. 27, 2021

(65) Prior Publication Data
US 2023/0061248 A1    Mar. 2, 2023

(51) Int. Cl.
*H04W 72/20*    (2023.01)

(52) U.S. Cl.
CPC .................. *H04W 72/20* (2023.01)

(58) Field of Classification Search
CPC ..................................... H04W 72/20
See application file for complete search history.

(56) References Cited

U.S. PATENT DOCUMENTS

2022/0264585 A1 *   8/2022   Yang ............... H04L 1/1812

* cited by examiner

*Primary Examiner* — Duc C Ho
(74) *Attorney, Agent, or Firm* — Holland & Hart LLP/QUALCOMM Incorporated

(57) ABSTRACT

Methods, systems, and devices for wireless communications at a user equipment (UE) are described. A UE may receive a signal indicating a configuration for a symbol reserved for automatic gain control. Based on the configuration for the symbol reserved for automatic gain control, the UE may multiplex assistance data with the symbol reserved for automatic gain control. In some examples, the UE may multiplex physical sidelink shared channel data or physical sidelink control channel data or both physical sidelink shared channel data and physical sidelink control channel data with the symbol reserved for automatic gain control. The UE may then transmit the multiplexed assistance data in the symbol reserved for automatic gain control.

44 Claims, 17 Drawing Sheets

RATE MATCHING ON SIDELINK AUTOMATIC GAIN CONTROL

INTRODUCTION

The following relates to wireless communications at a user equipment (UE), including managing communications on sidelink automatic gain control.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as UE.

SUMMARY

A method for wireless communication at a UE is described. The method may include receiving a signal indicating a configuration for a symbol reserved for automatic gain control. The method may include multiplexing assistance data with the symbol reserved for automatic gain control. The multiplexing may be based on the configuration for the symbol reserved for automatic gain control. The method may further include transmitting the multiplexed assistance data in the symbol reserved for automatic gain control.

An apparatus for wireless communication at a UE is described. The apparatus may include a processor, and memory coupled to the processor. The processor and memory configured to receive a signal indicating a configuration for a symbol reserved for automatic gain control. The processor and memory may be configured to multiplex assistance data with the symbol reserved for automatic gain control. The multiplexing may be based on the configuration for the symbol reserved for automatic gain control. The processor and memory may further be configured to transmit the multiplexed assistance data in the symbol reserved for automatic gain control.

Another apparatus for wireless communication at a UE is described. The apparatus may include means for receiving a signal indicating a configuration for a symbol reserved for automatic gain control. The apparatus may include means for means for multiplexing assistance data with the symbol reserved for automatic gain control. The multiplexing may be based on the configuration for the symbol reserved for automatic gain control. The apparatus may further include means for means for transmitting the multiplexed assistance data in the symbol reserved for automatic gain control.

A non-transitory computer-readable medium storing code for wireless communication at a UE is described. The code may include instructions executable by a processor to receive a signal indicating a configuration for a symbol reserved for automatic gain control and multiplex assistance data with the symbol reserved for automatic gain control. The multiplexing may be based on the configuration for the symbol reserved for automatic gain control. The code may further include instructions executable by the processor to transmit the multiplexed assistance data in the symbol reserved for automatic gain control.

In some examples of the method, apparatuses, and non-transitory computer-readable medium described herein, multiplexing physical sidelink shared channel data with the symbol reserved for automatic gain control. In some examples, the multiplexing may be based on the configuration for the symbol reserved for automatic gain control.

In some examples of the method, apparatuses, and non-transitory computer-readable medium described herein, multiplexing physical sidelink control channel data with the symbol reserved for automatic gain control. In some examples, the multiplexing may be based on the configuration for the symbol reserved for automatic gain control.

In some examples of the method, apparatuses, and non-transitory computer-readable medium described herein, multiplexing physical sidelink shared channel data and physical sidelink control channel data with the symbol reserved for automatic gain control. In some examples, the multiplexing may be based on the configuration for the symbol reserved for automatic gain control.

Some examples of the method, apparatuses, and non-transitory computer-readable medium described herein may further include operations, features, means, or instructions for generating a code block for physical sidelink shared channel data based on mapping a low-density parity-check code to a circular buffer. The examples of the method, apparatuses, and non-transitory computer-readable medium described herein may further include operations, features, means, or instructions for rate matching, at a second symbol subsequent to the symbol reserved for automatic gain control, one or more bits associated with the code block with a corresponding redundancy version, and mapping one or more parity check bits associated with the code block to the symbol reserved for automatic gain control.

Some examples of the method, apparatuses, and non-transitory computer-readable medium described herein may further include operations, features, means, or instructions for generating a code block for physical sidelink control channel data based on a polar code and rate matching, at a second symbol subsequent to the symbol reserved for automatic gain control, one or more bits associated with the code block. The examples of the method, apparatuses, and non-transitory computer-readable medium described herein may further include operations, features, means, or instructions for mapping one or more parity check bits associated with the code block to the symbol reserved for automatic gain control.

In some examples of the method, apparatuses, and non-transitory computer-readable medium described herein, a size of the code block may be based on a size of a sidelink control information resource and a size of an automatic gain control resource.

Some examples of the method, apparatuses, and non-transitory computer-readable medium described herein may further include operations, features, means, or instructions for determining a first set of multiple code blocks included in a transport block and a second set of multiple bits associated with the symbol reserved for automatic gain control and selecting one or more bits associated with the assistance data based on the first set of multiple code blocks included in the transport block and the second set of multiple bits associated with the symbol reserved for automatic gain control.

Some examples of the method, apparatuses, and non-transitory computer-readable medium described herein may further include operations, features, means, or instructions for selecting an equal number of bits for each code block of the first set of multiple code blocks and mapping a remaining number of bits to the symbol reserved for automatic gain control.

Some examples of the method, apparatuses, and non-transitory computer-readable medium described herein may further include operations, features, means, or instructions for selecting one or more bits associated with the assistance data based on a code block associated with the one or more bits and a demodulation reference signal.

Some examples of the method, apparatuses, and non-transitory computer-readable medium described herein may further include operations, features, means, or instructions for selecting one or more bits associated with the assistance data based on a priority of a code block associated with the one or more bits.

In some examples of the method, apparatuses, and non-transitory computer-readable medium described herein, the code block may be associated with an uplink control information, a medium access control (MAC) control element, or both.

Some examples of the method, apparatuses, and non-transitory computer-readable medium described herein may further include operations, features, means, or instructions for selecting one or more bits associated with the assistance data based on a set of multiple code blocks, where the one or more bits may be selected uniformly or non-uniformly for the set of multiple code blocks.

Some examples of the method, apparatuses, and non-transitory computer-readable medium described herein may further include operations, features, means, or instructions for transmitting an indication of selection of the set of multiple code blocks based on selecting the one or more bits associated with the assistance data. In some examples of the method, apparatuses, and non-transitory computer-readable medium described herein, the indication of the selection includes an indication of uniform selection, an indication of non-uniform selection, or both.

In some examples of the method, apparatuses, and non-transitory computer-readable medium described herein, the indication of the selection includes at least one of a first sidelink control information format, a second sidelink control information format, a MAC control element, a radio resource control, or a combination thereof.

Some examples of the method, apparatuses, and non-transitory computer-readable medium described herein may further include operations, features, means, or instructions for receiving a request to increase reliability associated with the set of multiple code blocks, where selecting the one or more bits associated with the assistance data may be based on the request.

In some examples of the method, apparatuses, and non-transitory computer-readable medium described herein, the assistance data includes at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

A method for wireless communication at a base station is described. The method may include determining a configuration for multiplexing assistance data with a symbol reserved for automatic gain control. The method may further include transmitting, to a UE, a signal indicating the configuration for multiplexing the assistance data with the symbol reserved for automatic gain control.

An apparatus for wireless communication at a base station is described. The apparatus may include a processor, and memory coupled to the processor. The processor and memory configured to determine a configuration for multiplexing assistance data with a symbol reserved for automatic gain control. The processor and memory may further be configured to transmit, to a UE, a signal indicating the configuration for multiplexing the assistance data with the symbol reserved for automatic gain control.

Another apparatus for wireless communication at a base station is described. The apparatus may include means for determining a configuration for multiplexing assistance data with a symbol reserved for automatic gain control. The apparatus may further include means for transmitting, to a UE, a signal indicating the configuration for multiplexing the assistance data with the symbol reserved for automatic gain control.

A non-transitory computer-readable medium storing code for wireless communication at a base station is described. The code may include instructions executable by a processor to determine a configuration for multiplexing assistance data with a symbol reserved for automatic gain control. The code may further include instructions executable by the processor to transmit, to a UE, a signal indicating the configuration for multiplexing the assistance data with the symbol reserved for automatic gain control.

Some examples of the method, apparatuses, and non-transitory computer-readable medium described herein may further include operations, features, means, or instructions for determining the configuration for multiplexing physical sidelink shared channel data with the symbol reserved for automatic gain control.

Some examples of the method, apparatuses, and non-transitory computer-readable medium described herein may further include operations, features, means, or instructions for determining the configuration for multiplexing physical sidelink control channel data with the symbol reserved for automatic gain control.

Some examples of the method, apparatuses, and non-transitory computer-readable medium described herein may further include operations, features, means, or instructions for determining the configuration for multiplexing physical sidelink shared channel data and physical sidelink control channel data with the symbol reserved for automatic gain control.

Some examples of the method, apparatuses, and non-transitory computer-readable medium described herein may further include operations, features, means, or instructions for determining a first set of multiple code blocks included in a transport block and a second set of multiple bits associated with the symbol reserved for automatic gain control and configuring the UE to select one or more bits associated with the assistance data based on the first set of multiple code blocks included in the transport block and the second set of multiple bits associated with the symbol reserved for automatic gain control.

Some examples of the method, apparatuses, and non-transitory computer-readable medium described herein may further include operations, features, means, or instructions for configuring the UE to select an equal number of bits for each code block of the first set of multiple code blocks and configuring the UE to map a remaining number of bits to the symbol reserved for automatic gain control.

Some examples of the method, apparatuses, and non-transitory computer-readable medium described herein may further include operations, features, means, or instructions for configuring the UE to select one or more bits associated with the assistance data based on a code block associated with the one or more bits and a demodulation reference signal.

Some examples of the method, apparatuses, and non-transitory computer-readable medium described herein may further include operations, features, means, or instructions for configuring the UE to select one or more bits associated with the assistance data based on a priority of a code block associated with the one or more bits. In some examples of the method, apparatuses, and non-transitory computer-readable medium described herein, the code block may be associated with an uplink control information, a MAC control element, or both.

In some examples of the method, apparatuses, and non-transitory computer-readable medium described herein, the assistance data includes at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

DETAILED DESCRIPTION

Figure 1:
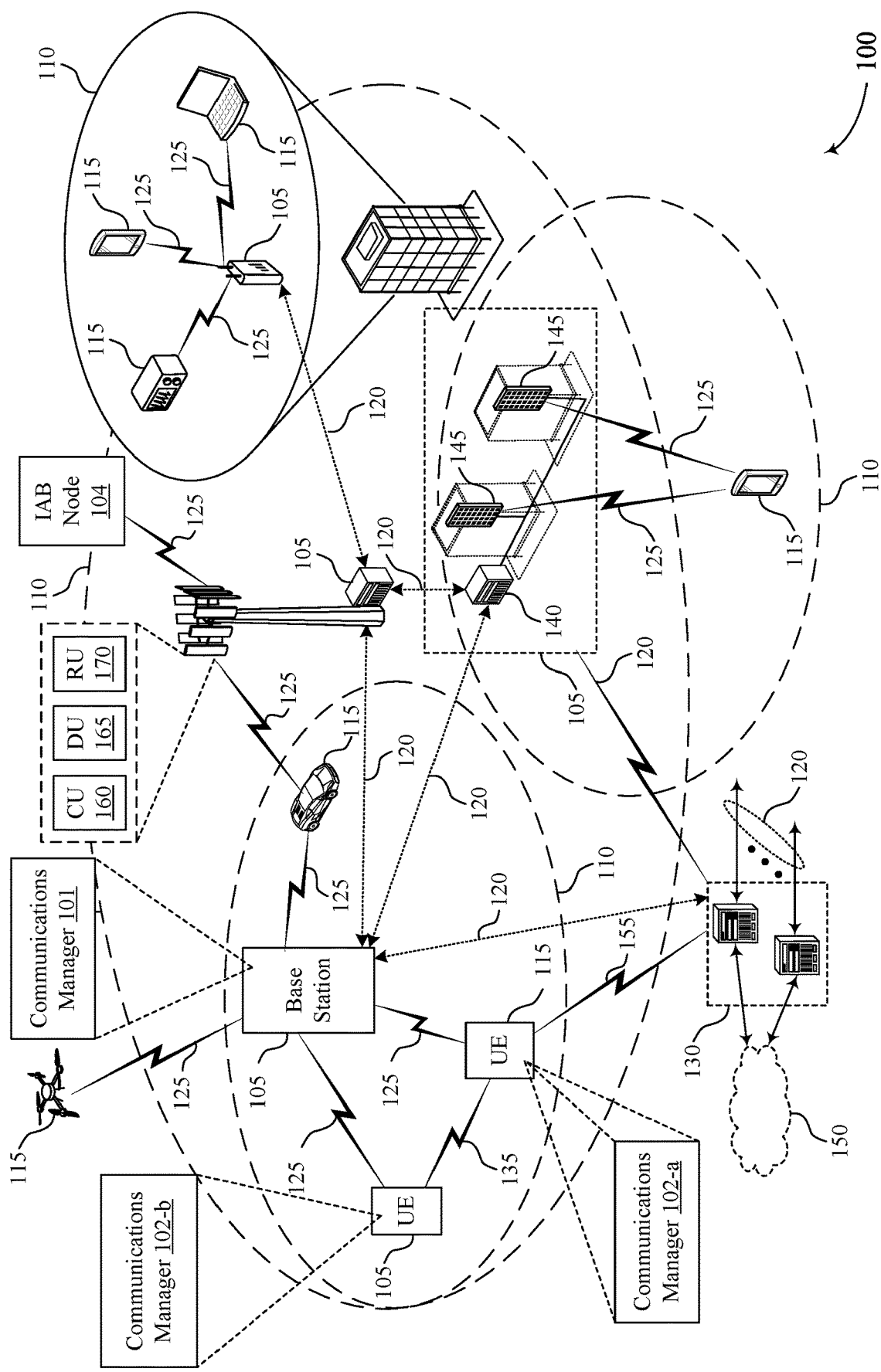
FIG. 1 illustrates an example of a wireless communications system that supports rate matching on sidelink automatic gain control in accordance with one or more aspects of the present disclosure.

A wireless communications system may support both access links and sidelinks for communications between one or more communication devices. An access link may refer to a communication link between a UE and a base station. For example, an access link may support uplink signaling, downlink signaling, connection procedures, etc. A sidelink may refer to any communication link between similar wireless devices (e.g., a communication link between UEs, or a backhaul communication link between base stations). It is noted that while various examples provided herein are discussed for UE sidelink devices, such sidelink techniques may be used for any type of wireless devices that use sidelink communications. For example, a sidelink may support one or more of device-to-device (D2D) communications, vehicle-to-everything (V2X) or vehicle-to-vehicle (V2V) communications, message relaying, discovery signaling, beacon signaling, or other signals transmitted over-the-air from one UE to one or more other UEs.

In some wireless communications systems supporting sidelink communications, a UE may receive transmissions from other UEs during a time slot. The UE may process (e.g., decode or attempt to decode) the transmission based on applying a gain to the transmissions (e.g., applying a gain to a signal derived from the transmissions). To decode a transmission while maintaining a gain for detection or decoding, the UE may perform an automatic gain control at a start of the time slot (e.g., during the first symbol of the time slot). Automatic gain control may include the UE detecting a power of the transmissions over the first symbol of the time slot and updating the gain for the remaining symbols of the time slot to receive a transmission. In some cases, the first symbol reserved for automatic gain control may be referred to as an automatic gain control symbol. However, having a dedicated symbol for performing automatic gain control may incur an overhead. Additionally, in use cases with low mobility, a timing for performing the automatic gain control may be faster based on past transmissions. Thus, a UE may not use a dedicated symbol for performing automatic gain control at the start of each time slot.

According to one or more aspects of the present disclosure, a UE may utilize the dedicated symbol for performing automatic gain control to multiplex assistance data. In some examples, the UE may receive a signal indicating a configuration for a symbol reserved for automatic gain control. The UE may multiplex assistance data with the symbol reserved for automatic gain control according to the configuration. The assistance data may include at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof. In some examples, upon receiving the configuration, the UE may multiplex parity check bits associated with physical sidelink shared channel data with the symbol reserved for automatic gain control. Additionally or alternatively, the UE may multiplex parity check bits associated with physical sidelink control channel data with the symbol reserved for automatic gain control. In some cases, the UE may multiplex parity check bits associated with both physical sidelink shared channel data and physical sidelink control channel data with the symbol reserved for automatic gain control. The UE may also perform an adaptive rate matching for multiplexing the parity check bits with the symbol reserved for automatic gain control. In addition, the UE may select the parity check bits for multiplexing with the symbol reserved for automatic gain control according to the configuration.

UEs supporting multiplexing assistance data with a symbol reserved for automatic gain control in sidelink communications systems may utilize the techniques described herein to experience power savings and extended battery life while ensuring reliable and efficient communications in the group of UEs. For example, the UE may transmit assistance data in the symbol otherwise allocated for automatic gain control to reduce retransmissions, thereby experiencing power savings at both transmitter UE and receiver UE. Particular aspects of the subject matter described in this disclosure may be implemented to support high reliability by transmitting assistance data, among other examples. The described techniques may thus include features for reducing power consumption, spectral efficiency, and provide with higher data rates.

Aspects of the disclosure are initially described in the context of wireless communications systems. Aspects of the disclosure are further described in the context of resource allocation and process flow. Aspects of the disclosure are further illustrated by and described with reference to apparatus diagrams, system diagrams, and flowcharts that relate to rate matching on sidelink automatic gain control.

FIG. 1 illustrates an example of a wireless communications system 100 that supports rate matching on sidelink automatic gain control in accordance with one or more aspects of the present disclosure. The wireless communications system 100 may include one or more base stations 105, one or more UEs 115, and a core network 130. In some aspects, the wireless communications system 100 may be an LTE network, an LTE-A network, an LTE-A Pro network, or an NR network. In some aspects, the wireless communications system 100 may support enhanced broadband communications, ultra-reliable communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more RATs.

The UEs 115 may be dispersed throughout a coverage area 110 of the wireless communications system 100, and each UE 115 may be stationary, or mobile, or both at different times. The UEs 115 may be devices in different forms or having different capabilities. Some aspect UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some aspects, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNB, a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some aspects, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples. In some implementations, the UEs 115 may be or include disaggregated UEs 115 in which one or more of the various functions and communication layers of the UE 115 may be split between multiple physical devices for communication between UEs 115 and base stations 105. In such cases, the disaggregated UE 115 may include the respective physical devices configured to perform various functions and communications.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1. A UE 115 may communicate with the core network 130 through a communication link 155.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (RAT) (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some aspects (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different RAT).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some aspects the carrier bandwidth may be referred to as a "system bandwidth" of the carrier or the wireless communications system 100. For example, the carrier bandwidth may be one of a number of determined bandwidths for carriers of a particular RAT (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some aspects, the wireless communications system 100 may include base stations 105 or UEs 115 that support simultaneous communications via carriers associated with multiple carrier bandwidths. In some aspects, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or DFT-S-OFDM). In a system employing MCM techniques, a resource element may include one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some aspects, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some aspects, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some aspects, a base station 105 may be movable and therefore provide communication coverage for a moving geographic coverage area 110. In some aspects, different geographic coverage areas 110 associated with different technologies may overlap, but the different geographic coverage areas 110 may be supported by the same base station 105. In other aspects, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different RATs.

Some UEs 115 may be configured to employ operating modes that reduce power consumption, such as half-duplex communications (e.g., a mode that supports one-way communication via transmission or reception, but not transmission and reception simultaneously). In some aspects, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some aspects, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some aspects, groups of the UEs 115 communicating via D2D communications may utilize a one-to-many (1:M) system in which each UE 115 transmits to every other UE 115 in the group. In some aspects, a base station 105 facilitates the scheduling of resources for D2D communications. In other cases, D2D communications are carried out between the UEs 115 without the involvement of a base station 105. In some aspects, a D2D communication link 135 may referred to as a sidelink which may facilitate communications between one or more UEs 115.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, for example, in the range of 300 megahertz (MHz) to 300 gigahertz (GHz). For example, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR4-a or FR4-1, and/or FR5, or may be within the EHF band.

The wireless communications system 100 may utilize both licensed and unlicensed radio frequency spectrum bands. For example, the wireless communications system 100 may employ License Assisted Access (LAA), LTE-Unlicensed (LTE-U) RAT, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some aspects, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some aspects, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some aspects, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some aspects, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a CSI-RS), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A MAC layer may perform priority handling and multiplexing of logical channels into transport channels. The MAC layer may also use error detection techniques, error correction techniques, or both to support retransmissions at the MAC layer to enhance link efficiency. In the control plane, the radio resource control protocol layer may provide establishment, configuration, and maintenance of a radio resource control connection between a UE 115 and a base station 105 or a core network 130 supporting radio bearers for user plane data. At the physical layer, transport channels may be mapped to physical channels.

Techniques described herein, in addition to or as an alternative to be carried out between UEs 115 and base stations 105, may be implemented via additional or alternative wireless devices, including IAB nodes 104, distributed units (DUs) 165, centralized units (CUs) 160, radio units (RUs) 170, and the like. For example, in some implementations, aspects described herein may be implemented in the context of a disaggregated radio access network (RAN) architecture (e.g., open RAN architecture). In a disaggregated architecture, the RAN may be split into three areas of functionality corresponding to the CU 160, the DU 165, and the RU 170. The split of functionality between the CU 160, DU 165, and RU 170 is flexible and as such gives rise to numerous permutations of different functionalities depending upon which functions (e.g., MAC functions, baseband functions, radio frequency functions, and any combinations thereof) are performed at the CU 160, DU 165, and RU 170. For example, a functional split of the protocol stack may be employed between a DU 165 and an RU 170 such that the DU 165 may support one or more layers of the protocol stack and the RU 170 may support one or more different layers of the protocol stack.

Some wireless communications systems (e.g., wireless communications system 100), infrastructure and spectral resources for NR access may additionally support wireless backhaul link capabilities in supplement to wireline backhaul connections, providing an IAB network architecture. One or more base stations 105 may include CUs 160, DUs 165, and RUs 170 and may be referred to as donor base stations 105 or IAB donors. One or more DUs 165 (e.g., and/or RUs 170) associated with a donor base station 105 may be partially controlled by CUs 160 associated with the donor base station 105. The one or more donor base stations 105 (e.g., IAB donors) may be in communication with one or more additional base stations 105 (e.g., IAB nodes 104) via supported access and backhaul links. IAB nodes 104 may support mobile terminal (MT) functionality controlled and/or scheduled by DUs 165 of a coupled IAB donor. In addition, the IAB nodes 104 may include DUs 165 that support communication links with additional entities (e.g., IAB nodes 104, UEs 115, etc.) within the relay chain or configuration of the access network (e.g., downstream). In such cases, one or more components of the disaggregated RAN architecture (e.g., one or more IAB nodes 104 or components of IAB nodes 104) may be configured to operate according to a configuration described herein.

In some examples, the wireless communications system 100 may include a core network 130 (e.g., a next generation core network (NGC)), one or more IAB donors, IAB nodes 104, and UEs 115, where IAB nodes 104 may be partially controlled by each other and/or the IAB donor. The IAB donor and IAB nodes 104 may be examples of aspects of base stations 105. IAB donor and one or more IAB nodes 104 may be configured as (e.g., or in communication according to) some relay chain.

For instance, an access network (AN) or RAN may refer to communications between access nodes (e.g., IAB donor), IAB nodes 104, and one or more UEs 115. The IAB donor may facilitate connection between the core network 130 and the AN (e.g., via a wireline or wireless connection to the core network 130). That is, an IAB donor may refer to a RAN node with a wireline or wireless connection to core network 130. The IAB donor may include a CU 160 and at least one DU 165 (e.g., and RU 170), where the CU 160 may communicate with the core network 130 over an NG interface (e.g., some backhaul link). The CU 160 may host layer 3 (L3) (e.g., radio resource control, service data adaption protocol (SDAP), PDCP, etc.) functionality and signaling. The at least one DU 165 and/or RU 170 may host lower layer, such as layer 1 (L1) and layer 2 (L2) (e.g., RLC, MAC, physical (PHY), etc.) functionality and signaling, and may each be at least partially controlled by the CU 160. The DU 165 may support one or multiple different cells. IAB donor and IAB nodes 104 may communicate over an F1 interface according to some protocol that defines signaling messages (e.g., F1 AP protocol). Additionally, CU 160 may communicate with the core network over an NG interface (which may be an example of a portion of backhaul link), and may communicate with other CUs 160 (e.g., a CU 160 associated with an alternative IAB donor) over an Xn-C interface (which may be an example of a portion of a backhaul link).

IAB nodes 104 may refer to a RAN node that provides IAB functionality (e.g., access for UEs 115, wireless self-backhauling capabilities, etc.). IAB nodes 104 may include a DU 165 and an MT. A DU 165 may act as a distributed scheduling node towards child nodes associated with the IAB node 104, and the MT may act as a scheduled node towards parent nodes associated with the IAB node 104. That is, an IAB donor may be referred to as a parent node in communication with one or more child nodes (e.g., an IAB donor may relay transmissions for UEs through one or more other IAB nodes 104). Additionally, an IAB node 104 may also be referred to as a parent node or a child node to other IAB nodes 104, depending on the relay chain or configuration of the AN. Therefore, the MT entity of IAB nodes 104 (e.g., MTs) may provide a Uu interface for a child node to receive signaling from a parent IAB node 104, and the DU interface (e.g., DUs 165) may provide a Uu interface for a parent node to signal to a child IAB node 104 or UE 115.

For example, IAB node 104 may be referred to a parent node associated with IAB node, and a child node associated with IAB donor. The IAB donor may include a CU 160 with a wireline (e.g., optical fiber) or wireless connection to the core network, and may act as parent node to IAB nodes 104. For example, the DU 165 of IAB donor may relay transmissions to UEs 115 through IAB nodes 104, and may directly signal transmissions to a UE 115. The CU 160 of IAB donor may signal communication link establishment via an F1 interface to IAB nodes 104, and the IAB nodes 104 may schedule transmissions (e.g., transmissions to the UEs 115 relayed from the IAB donor) through the DUs 165. That is, data may be relayed to and from IAB nodes 104 via signaling over an NR Uu interface to MT of the IAB node 104. Communications with IAB node 104 may be scheduled by DU 165 of IAB donor and communications with IAB node 104 may be scheduled by DU 165 of IAB node 104.

In the case of the techniques described herein applied in the context of a disaggregated RAN architecture, one or more components of the disaggregated RAN architecture (e.g., one or more IAB nodes 104 or components of IAB nodes 104) may be configured to operate to perform sidelink communications as described herein.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may enhance throughput at the MAC layer in poor radio conditions (e.g., low signal-to-noise conditions). In some aspects, a device may support same-slot HARQ feedback, where the device may provide HARQ feedback in a specific slot for data received in a previous symbol in the slot. In other cases, the device may provide HARQ feedback in a subsequent slot, or according to some other time interval.

The wireless communications system 100 may be configured to support rate matching on sidelink automatic gain control. For example, base stations 105 may include a communications manager 101 and UEs 115 may include a communications manager 102 that may support operating in accordance with a configuration for a symbol reserved for automatic gain control. For instance, a base station 105 may include a communications manager 101, a first UE 115 may include a communications manager 102-a, and a second UE 115 may include a communications manager 102-b. The communications manager 101 may be examples of aspects of a communications manager as described in FIGS. 9 through 12. The communications manager 102-a and the communications manager 102-b may be examples of aspects of a communications manager as described in FIGS. 5 through 8.

By way of example, a first UE 115 (e.g., using the communications manager 102-a) may communicate with a base station 105 (e.g., using the communications manager 101) and with a second UE 115 (e.g., using the communications manager 102-b). The first UE 115 may receive, from the base station 105, a signal indicating a configuration for a symbol reserved for automatic gain control. To reduce processing overhead, the first UE 115 may multiplex assistance data with the symbol reserved for automatic gain control based on receiving the configuration for the symbol reserved for automatic gain control. In some examples, the first UE 115 may transmit, to the second UE 115, the multiplexed assistance data in the symbol reserved for automatic gain control.

Figure 2:
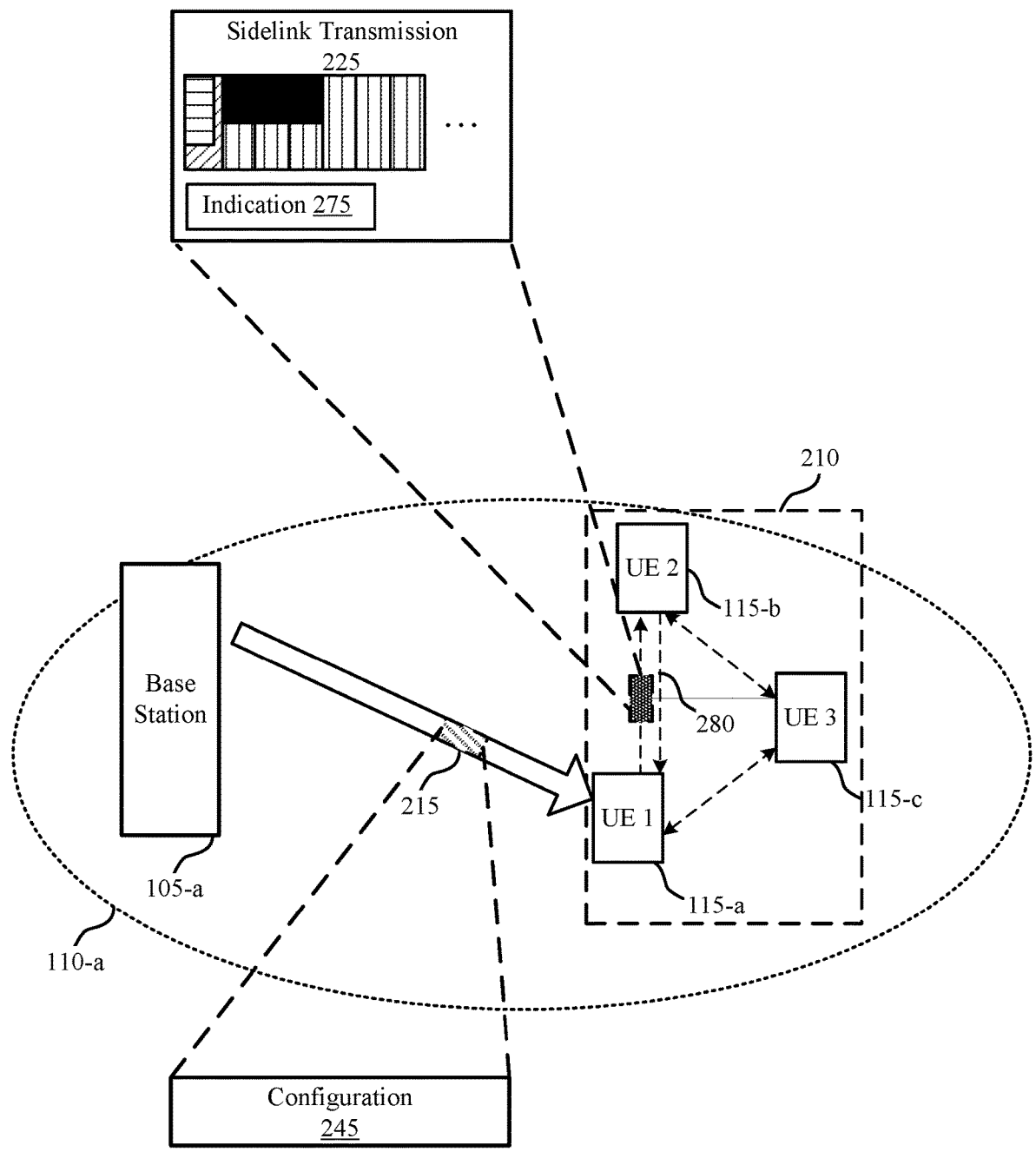
FIG. 2 illustrates an example of a wireless communications system that supports rate matching on sidelink automatic gain control in accordance with one or more aspects of the present disclosure.
Figure 2:
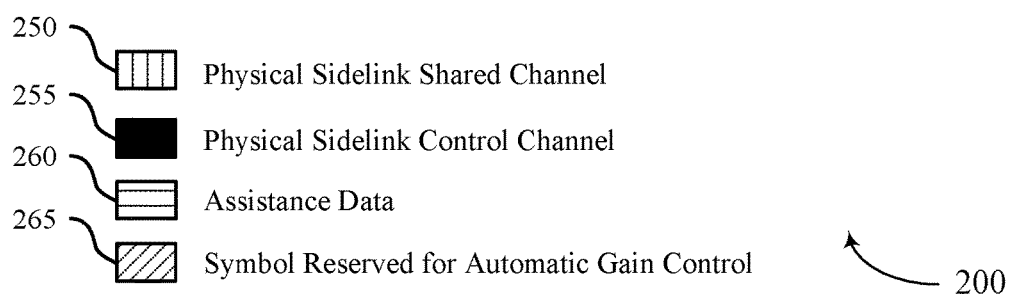

FIG. 2 illustrates an example of a wireless communications system 200 that supports rate matching on sidelink automatic gain control in accordance with one or more aspects of the present disclosure. In some examples, the wireless communications system 200 may implement aspects of wireless communications system 100. The wireless communications system 200 includes a base station 105-a, a geographic coverage area 110-a, and one or more UEs 115 (may also be referred to as devices).

In some examples, the wireless communications system 200 may utilize control signaling to schedule resources for the UEs 115 to perform sidelink communications. Additionally or alternatively, the UEs 115 in the wireless communications system 200 may utilize shared information to enhance scheduling, inter-UE coordination, and communications flexibility. In some examples, the group of UEs 115 (for example, UE 115-a (UE 1), UE 115-b (UE 2), and UE 115-c (UE 3)) may communicate with each other (for example, within a V2X system, a D2D system, among other examples) and may employ sidelink transmissions to save power, reduce latency, and ensure reliable communications.

In some examples, vehicles may communicate using V2X resource allocation mode 2 (that utilizes UE autonomous resource selection).

The wireless communications system 200 may support both access links and sidelinks for communications between one or more communication devices. An access link may refer to a communication link between a UE 115 (such as, UE 115-a, UE 115-b and UE 115-c) and a base station 105-a. A sidelink may refer to any communication link between similar wireless devices (for example, a communication link between UEs, or a backhaul communication link between base stations). It is noted that while various examples provided herein are discussed for UE sidelink devices, such sidelink techniques may be used for any type of wireless devices that use sidelink communications. For example, a sidelink may support one or more of D2D communications, V2X or V2V communications, message relaying, discovery signaling, beacon signaling, or other signals transmitted over-the-air from one UE to one or more other UEs.

The base station 105-a may communicate with one or more UEs 115 (for example, UEs 115-a, UE 115-b, and UE 115-c), which may be included within a UE group 210. For example, the base station 105-a may transmit a control signal 215 to the UE 115-a (UE 1)/Although not depicted in the example of FIG. 2, the base station 105-a may transmit a control signal 215 to the UE 115-b (UE 2), or the UE 115-c (UE 3). As depicted in the example of FIG. 2, the UE 115-a, the UE 115-b, and the UE 115-c may communicate with each other (or with another group of UEs 115) over sidelink communications (for example, using a peer-to-peer (P2P) or D2D protocol). In some examples, the UE 115-a may transmit sidelink transmissions to the UE 115-b or the UE 115-c. In some examples, the UE 115-a or the UE 115-b may monitor resource pools for the sidelink communications or indications of the sidelink communications (for example, resource reservations, control channel transmissions, among other examples) from other UEs 115 in the group. Additionally or alternatively, the UEs 115 may have data to transmit to (or receive from) a UE 115 in the UE group 210 and may use the sidelink communications to transmit the data transmission. In some examples, the UE group 210 of the UEs 115 may utilize sidelinks communications in addition to access links with the base station 105-a. In some examples, the control signal 215 may indicate a configuration 245 for a symbol reserved for automatic gain control.

As depicted herein, sidelink communications may support communications within a group of UEs 115 (for example, UE group 210). For instance, sidelink communications may include communications between a UE (such as, UE 115-a, UE 115-b, and UE 115-c) and other UEs 115 within a coverage area including the group of UEs (for example, a coverage area provided by a base station, a coverage area outside of the coverage area provided by the base station, or a combination thereof). A UE 115 in the group of UEs 115 may initiate sidelink communications with other UEs in the group of UEs. For example, the UEs 115 may be in a coverage area 110-a (for example, a coverage area 110 with reference to FIG. 1) of the base station 105-a. In such examples, a UE 115 may communicate with the base station 105-a via a Uu interface (for example, the base station 105-a may transmit downlink communications to the UE 115 via an access link). In some other examples, the group of UEs 115 may not be inside the coverage area or may not communicate with the base station 105 a using an access link.

In some examples, the UE 115 (such as, UE 115-a, UE 115-b, and UE 115-c) may have information (for example, a detection of an object or obstacle on a road in a V2X system, scheduling information, among other examples) to transmit to the group of UEs 115, and the UE 115 may initiate sidelink communications including the information to the other UEs 115. In such cases, the UE 115 initiating the sidelink communications may be referred to as a transmitting UE and the UE 115 receiving the sidelink communications may be referred to as a receiving UE. In some examples, the base station 105-a may configure sidelink communication resources for the group of UEs using a configuration message (for example, semi-persistent scheduling configuration message). In some examples, the base station 105-a may communicate the control signal 215 indicating a resource allocation for the UEs included in the group of UEs.

According to one or more aspects of wireless communications systems, UEs 115 (e.g., UE 115-a and UE 115-b) may perform sidelink communications. For instance, the UE 115-a may transmit sidelink transmissions 225. The sidelink transmissions 225 may span one slot or may span multiple slots (e.g., using slot aggregation). Additionally, each of the sidelink transmissions 225 may include a control region and a data region. A receiving UE (such as, UE 115-b) may determine a receive power associated with the transmissions received in each slot (such as, the sidelink transmissions 225). In general, a total received signal power (e.g., a received signal strength indicator) may vary from a first slot to a second slot. In some cases, the total received signal power of a first slot may be independent of a second slot unless the two slots have a temporal or spatial correlation.

In wireless communications system 200, a receiving UE (such as, UE 115-b) may perform an automatic gain control retraining or setting at the beginning of a slot. In some examples, automatic gain control retraining may be performed at the beginning of each slot, as it may be assumed that total received signal power may vary from the first slot to the second slot, or may be performed for a subset of slots (e.g., may be performed for a first slot of a set of temporally correlated slots). Automatic gain control may determine a front end gain to use to receive transmissions in a slot where automatic gain control retraining is being performed based on a total received signal power at the beginning of the slot. In general, automatic gain control retraining may occur over an automatic gain control setting time which may include a received signal strength indicator measurement, determining a gain setting, and programming the front end.

Some wireless communications systems may support a dedicated symbol for automatic gain control calibration. The first symbol of each sidelink slot may be a duplication of the second one. In such examples, the first symbol is dedicated for automatic gain control calibration as interference and power level may change rapidly in sidelink communications. In addition, automatic gain control calibration may be used by the UEs 115 for increasing analog to digital converter performance, which in turn increases the signal quality after converting from analog to digital. If the UEs do not perform automatic gain control calibration, then the received signal may have a low signal to noise ratio due to either clipping or large quantization noise. Longer calibration time leads to more accurate automatic gain control calibration in a dynamic environment. However, a dedicated symbol for automatic gain control may constitute a large overhead. For example, automatic gain control calibration may include 7% for a 14 symbol sidelink slot configuration and 14% for a 7 symbol sidelink slot configuration. This overhead is systematic for every sidelink transmission. However, some sidelink transmissions may operate with low to moderate mobility. In such instances, automatic gain control calibration may be faster based on past transmissions and thus, a dedicated symbol for automatic gain control calibration may result in increased overhead.

One or more aspects of the present disclosure provide for techniques to multiplex assistance data with the symbol reserved for automatic gain control. As depicted with reference to FIG. 2, the base station 105-a may transmit a signal (e.g., control signal 215) indicating a configuration 245 for a symbol reserved for automatic gain control. A UE 115-a may receive the configuration via the control signal 215, and may multiplex assistance data 260 (or non-essential data) with the symbol 265 reserved for automatic gain control. The UE 115-a may then transmit the multiplexed assistance data 260 in the symbol 265 reserved for automatic gain control. In some examples, multiplexing some data (e.g., data for decoding operation) with the symbol 265 reserved for automatic gain control may not be reliable for decoding. However, multiplexing assistance data 260 (non-essential data or data that improves reliability of sidelink communication but without which a reception is successful at a receiving UE) with the symbol 265 reserved for automatic gain control may enhance reliability or throughput. A UE 115-b receiving the assistance data may first perform an automatic gain control calibration. If the automatic gain control calibration is completed prior to the completion of transmission of the symbol 265 reserved for automatic gain control, then the UE 115-b may receive assistance data 260 (or non-essential data) offering extra payload or protection through parity check bits (e.g., the assistance data 260 may include the parity check bits).

In some examples, the UE 115-a may transmit a physical sidelink shared channel 250 and a physical sidelink control channel 255 in the sidelink transmission 225. The UE 115-a may utilize a symbol (e.g., symbol 265) to perform automatic gain control operation. According to aspects depicted herein, the UE 115-a may multiplex or otherwise transmit assistance data 260 in the symbol 265 reserved for automatic gain control. According to a first option, the UE 115-a may multiplex physical sidelink shared channel data with the symbol reserved for automatic gain control. The UE 115-a may transmit parity check bits (e.g., in assistance data 260) in a low-density parity-check circular buffer, that offers extra error correction capability. According to a second option, the UE 115-a may multiplex physical sidelink control channel data with the symbol reserved for automatic gain control. For example, the UE 115-a may transmit punctured polar coded bits (e.g., in assistance data 260) on symbol 265 reserved for automatic gain control. In some examples, the punctured polar coded bits may include or may not include bits for sidelink control information (e.g., SCI-2). According to a third option, the UE 115-a may multiplex physical sidelink shared channel data and physical sidelink control channel data (parity check bits from both the physical sidelink shared channel data and the physical sidelink control channel data may be included in assistance data 260) with the symbol 265 reserved for automatic gain control. For example, the UE 115-a may transmit other parity bits for both data and control channels (e.g., for physical sidelink shared channel 250 and physical sidelink control channel 255). As depicted herein, the base station 105-a may transmit a configuration to switch between the options of multiplexing assistance data 260 (using the control signal 215).

According to one or more aspects, the UE 115-a may perform an adapted rate-matching flow for physical sidelink shared channel. The UE 115-a may generate a code block for physical sidelink shared channel data based on mapping a low-density parity-check code to a circular buffer. The UE 115-a may generate systematic bits followed by parity check bits denoted as g01, g11, g21, . . . , gN1 for a first code block. The UE 115-a may then select redundancy versions (RVs) (e.g., RV 0, 1, 2, 3) for transmission. In some examples, RV 0 and RV 3 may be self-decodable, where RV 0 starts with systematic bits and follows with check bits and RV 3 starts with check bits and follows with systematic bits. The UE 115-a may perform a rate-matching for code block bits with corresponding RVs starting from the second symbol. Thus, the UE 115-a may rate match, at a second symbol subsequent to the symbol reserved for automatic gain control, one or more bits associated with the code block with a corresponding RV. In some examples, the UE 115-a may map one or more parity check bits to resources with corresponding RV. In some examples, the UE 115-a may map one or more parity check bits associated with the code block to the symbol reserved for automatic gain control.

In some examples, the UE 115-a may map other parity check bits in a circular buffer to the symbol reserved for automatic gain control (e.g., first symbol). The parity check bits may include a continuation of previously mapped bits (determined by an RV) in the circular buffer. A first symbol of a slot may be subject to distortions. The UE 115-a may include parity check bits in the symbol reserved for automatic gain control for error corrections. In some examples, the parity check bits may be interleaved before mapping. If a receiver UE (e.g., UE 115-b) may determines that the automatic gain control level has changed (more than a threshold level) during a symbol reception, then the UE 115-b may determine that the parity check bits are unreliable and may discard the parity check bits. Alternatively, if the UE 115-b determines that the automatic gain control level has not changed during a symbol reception, then the UE 115-b may determine to use the parity check bits for error correction.

According to one or more aspects, the UE 115-a may perform an adapted rate-matching flow for physical sidelink control channel (e.g., SCI-1 and/or SCI-2). The UE 115-a may perform a code block generation with polar code. The UE 115-a may rate match an output length E based on a size of a sidelink control information resource and a size of an automatic gain control resource. The UE 115-a may determine a code block length N is based on the output length E. The UE 115-a may then perform rate-matching starting from the second symbol of the SCI-1 and/or SCI-2. Thus, the UE 115-a may generate a code block for physical sidelink control channel data based on a polar code. The UE 115-a may rate match, at a second symbol subsequent to the symbol reserved for automatic gain control, one or more bits associated with the code block. In some examples, the UE 115-a may map the parity check bits to resources with corresponding modulation and coding scheme. Additionally or alternatively, the UE 115-a may map other parity check bits to the first symbol. That is, after rate matching, the UE 115-a may map one or more parity check bits associated with the code block to the symbol reserved for automatic gain control. In some examples, a receiver UE (e.g., UE 115-b) may use the first symbol for automatic gain control only if an automatic gain control calibration exceeds a threshold time. In some examples, the receiver UE (e.g., UE 115-b) may use the first symbol for error correction only, if a transmitter or a hardware indicates no re-calibration is needed. In some examples, a receiver UE (e.g., UE 115-b) may use the first symbol for both automatic gain control and error correction, if the automatic gain control time is below a threshold time (e.g., within a cyclic prefix) duration.

In some examples, the UE 115-a may select the assistance data 260 from a set of code blocks (shown in further details in FIG. 3). The UE 115-a may then transmit an indication 275 of selection of the set of code blocks based on selecting the assistance data 260. The indication of the selection may include an indication of uniform selection or an indication of non-uniform selection or both. Details regarding uniform selection and non-uniform selection are further discussed with reference to FIG. 3.

In some examples, the indication of the selection may include at least one of a first sidelink control information format, a second sidelink control information format, a MAC control element, a radio resource control, or a combination thereof. A receiving UE 115-b may transmit a signaling 280 (via MAC control element) to request high reliability (e.g., extra protection) for code block groups that may experience periodic interference and inaccurate channel estimations due to mobility based on history of observations. The UE 115-a may receive a request to increase reliability associated with the set of code blocks. The UE 115-a may select the one or more bits associated with the assistance data is based on the request.

Figure 3A:
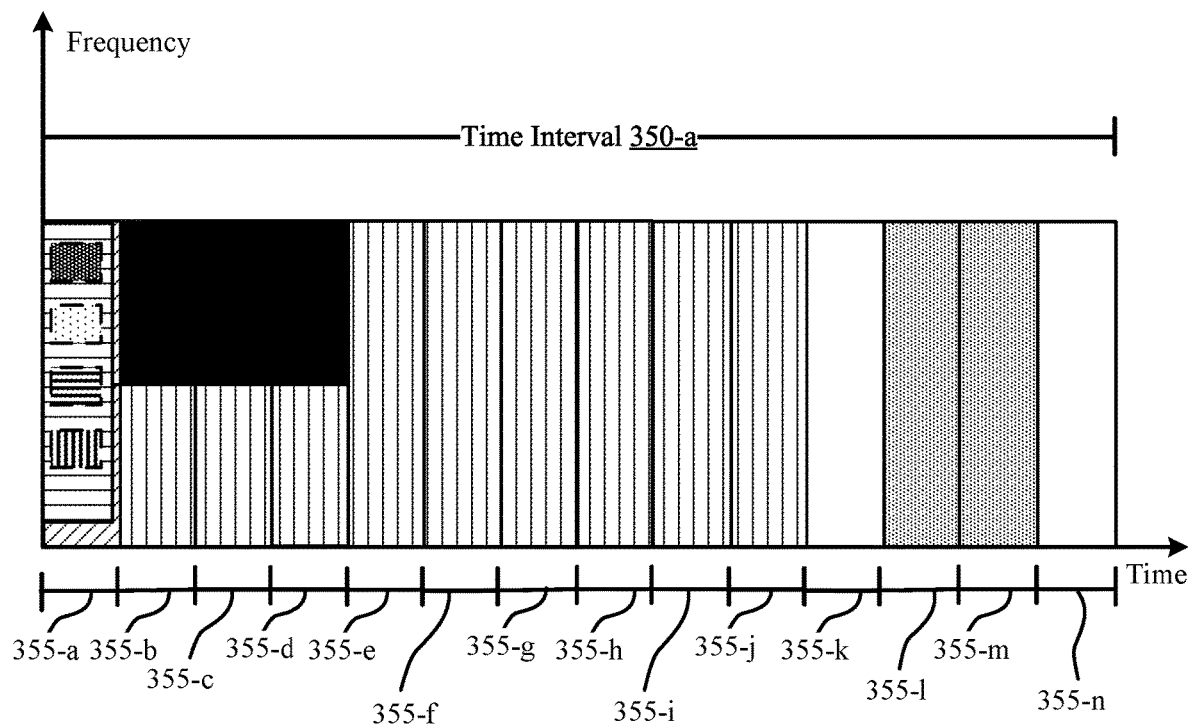
FIGS. 3A and 3B illustrate examples of resource allocations that support rate matching on sidelink automatic gain control in accordance with one or more aspects of the present disclosure.
Figure 3A:
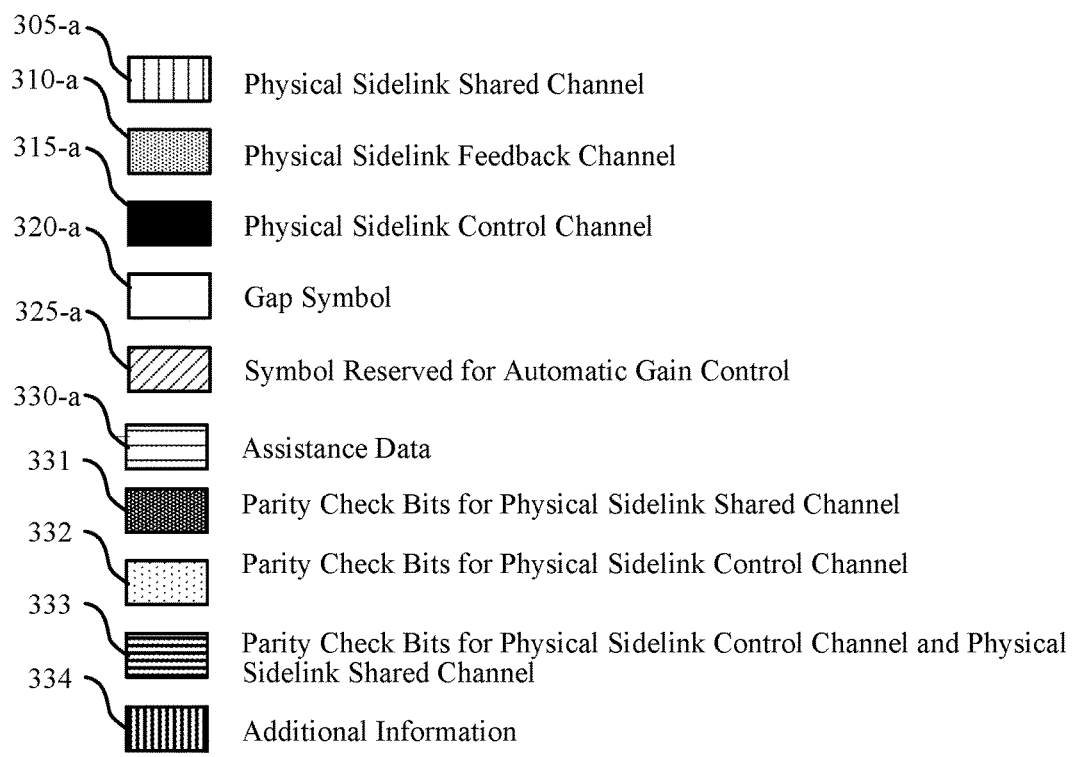
Figure 3B:
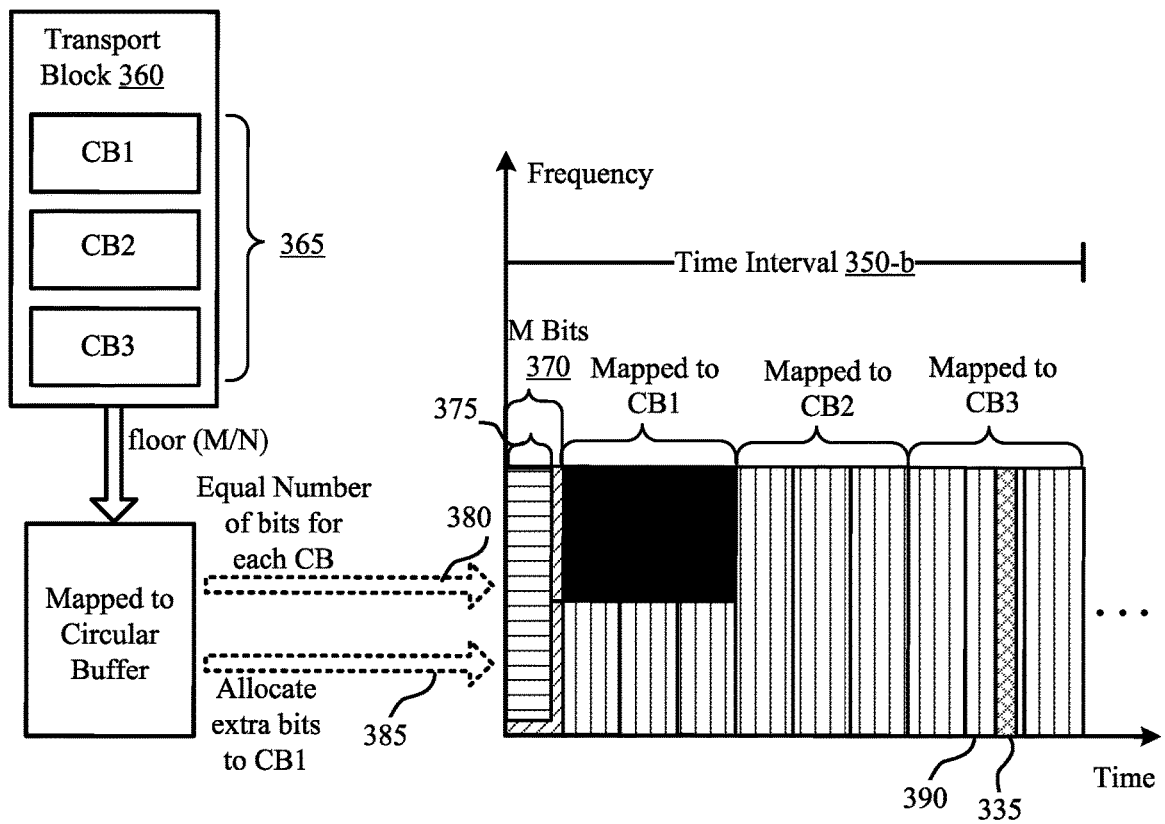
Figure 3B:
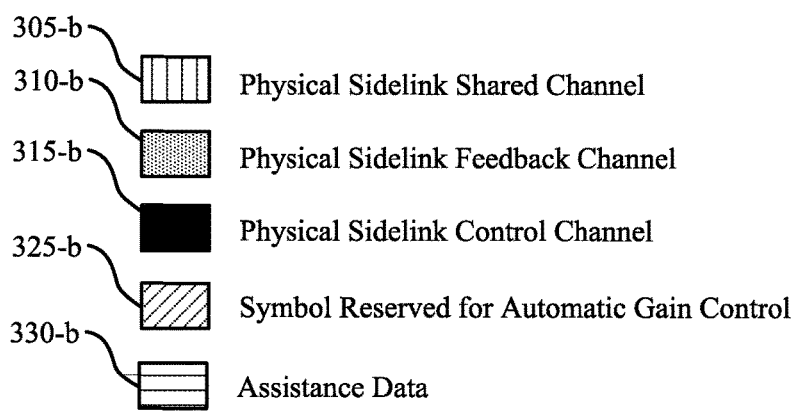

FIGS. 3A and 3B illustrate examples of a resource allocation 300 and a resource allocation 301 that support rate matching on sidelink automatic gain control in accordance with one or more aspects of the present disclosure. The resource allocation 300 and the resource allocation 301 may implement various aspects of the wireless communications system 100 or may be implemented by various aspects of the wireless communications system 100, among other examples. For example, the resource allocation 300 and the resource allocation 301 may be based on a configuration by a base station 105 and implemented by a UE 115. The resource allocation 300 and the resource allocation 301 may be used to rate match on a symbol reserved for sidelink automatic gain control to achieve greater reliability and lower latency operations in a wireless communications system. The resource allocation 300 and the resource allocation 301 may also be based on a configuration by the base station 105, and implemented by the UE 115 to decrease power consumption by the UE 115 while performing communication operations.

In some examples, a base station 105 and UEs 115 may utilize sidelink communications between the UEs 115 using Mode 1 resource allocation and Mode 2 resource allocation. In the example illustrated in FIG. 3A, the resource allocation 300 may include a slot including 14 symbol periods (e.g., symbol period 355-a, symbol period 355-b, symbol period 355-c, symbol period 355-d, symbol period 355-e, symbol period 355-f, symbol period 355-g, symbol period 355-h, symbol period 355-i, symbol period 355-j, symbol period 355-k, symbol period 355-l, symbol period 355-m, and symbol period 355-n). Each symbol period 355 may include time resources (e.g., symbols, minislots, slots, subframes, or a frame) as well as frequency resources (e.g., carriers, subcarriers, bands, bandwidth parts, resource blocks, or other groupings of subcarriers). A combination of a time resource, such as a symbol, and a frequency resource, such as a subcarrier, may define an associated resource element. As depicted in FIG. 3A, the time interval 350-a includes a control region 315-a including physical sidelink control channel from the UE (spanning 3 symbols). The time interval 350-a further includes a data region 305-a including physical sidelink shared channel from the UE 115, a feedback region 310-a including physical sidelink feedback channel from the UE 115, and gap symbol 320-a (spanning 2 symbols). The time interval 350-a also includes a symbol 325-a reserved for automatic gain control. As depicted in FIG. 3B, the time interval 350-b includes a control region 315-b including physical sidelink control channel from the UE (spanning 3 symbols), a data region 305-b including physical sidelink shared channel from the UE 115, and a symbol 325-b reserved for automatic gain control.

According to one or more aspects of the present disclosure, a UE 115 may receive a signal indicating a configuration for a symbol reserved for automatic gain control. The UE 115 may multiplex assistance data 340 with the symbol 325 reserved for automatic gain control based on the configuration. As depicted in the example of FIG. 3A, the assistance data 330-a may include at least one of parity check bits 331 associated with a physical sidelink control channel, parity check bits 332 associated with a physical sidelink shared channel, parity check bits 333 associated with the physical sidelink control channel and the physical sidelink shared channel, and additional information 334, or a combination thereof. In some examples, the additional information 334 may include an inter-UE co-ordination message, a feedback code book, a tracking reference signal, a channel state information report, or a combination thereof. The assistance data 330-a may optionally include one or more of the parity check bits 331 associated with a physical sidelink control channel, the parity check bits 332 associated with a physical sidelink shared channel, the parity check bits 333 associated with the physical sidelink control channel and the physical sidelink shared channel, and the additional information 334.

In the example of FIG. 3B, the UE 115 may transmit a transport block 360. The transport block 360 includes a first set of code blocks 365. The first set of code blocks 365 include code block 1 (CB1), code block 2 (CB2), and code block 3 (CB3). In some examples, the UE 115 may determine the first set of code blocks 365 included in a transport block 360 and a second set of bits 370 associated with the symbol 325-b reserved for automatic gain control. For instance, the UE 115 may consider that one transport block includes N code blocks (here, it is depicted as 3). The UE 115 may determine that the symbol 325-b reserved for automatic gain control can accommodate M bits 370 depending on modulation and coding scheme and frequency allocation (based on a resource allocation of a corresponding symbol period). The UE 115 may select one or more bits 375 associated with the assistance data 330-b based on the first set of code blocks 365 included in the transport block and the second set of bits (M bits 370) associated with the symbol 325-b reserved for automatic gain control.

According to some aspects, the UE 115 may determine the bits 375 for transmission on the symbol 325-b reserved for automatic gain control for uniform protection for code block (or code block groups). In some instances, the UE 115 may select an equal number of bits for each code block (CB1, CB2 and CB3) in the first set of code blocks 365. The UE 115 may calculate floor(M/N) to identify the additional bits. The additional bits are mapped in a circular buffer and are then mapped on the symbol 325-b reserved for automatic gain control. The rest M−floor(M/N) bits can be repetitions of the additional bits. For example, the UE 115 may select an equal number of bits for each code block (CB1, CB2 and CB3) of the first set of code blocks 365 and map a remaining number of bits to the symbol 325-b reserved for automatic gain control. As depicted in 380, the UE 115 may map an equal number of bits for each code block (CB1, CB2 and CB3) of the first set of code blocks 365 to the symbol 325-b reserved for automatic gain control.

Additionally or alternatively, the UE 115 may determine the bits 375 for transmission on the symbol 325-b reserved for automatic gain control for non-uniform protection for code block (or code block groups). In some instances, the UE 115 may select an unequal number of bits for each code block (CB1, CB2 and CB3) of the first set of code blocks 365. As depicted in the example of FIG. 3B, the code block 1 (CB1) is mapped to the first three symbols of the physical sidelink shared channel 305-b, the code block 2 (CB2) is mapped to the next three symbols of the physical sidelink shared channel 305-b and the code block 3 (CB3) is mapped to the next symbols of the physical sidelink shared channel 305-b. As depicted in FIG. 3B, the symbol 390 may include a demodulation reference signal 335. The UE 115 may select one or more bits 375 associated with the assistance data 330-b based on a code block (e.g., CB1) associated with the one or more bits and the demodulation reference signal 335. That is, the UE 115 may allocate extra bits to code blocks mapped farther away from a demodulation reference signal 335. As depicted in 385, the UE 115 may allocate extra bits to code block 1 (CB1). For example, the one or more bits 375 associated with the assistance data 330-b may include more bits from CB1 than from CB2 and CB3. In some examples, the UE 115 may allocate extra bits to code blocks conveying high priority information (e.g., uplink control information and MAC-CE). The UE 115 may select one or more bits 375 associated with the assistance data 330-b based on a priority of a code block associated with the one or more bits.

In some examples, the UE 115 may determine the bits 375 for transmission on the symbol 325-b reserved for automatic gain control to increase reliability of later code blocks (to save processing time for earlier code blocks). The UE 115 may switch between options to determine the bits for transmission on the symbol 325-b reserved for automatic gain.

In some instances, the UE 115 may select one or more bits 375 associated with the assistance data 330-b based on a set of code blocks 365, where the one or more bits are selected uniformly or non-uniformly for the set of code blocks. The one or more bits 375 associated with the assistance data 330-b may include extra bits for physical sidelink shared channel 305-b (e.g., SCI-1 or SCI-2). If the UE 115 selects the one or more bits 375 non-uniformly, then the UE 115 may transmit an indication the code blocks that are better or less protected.

In some examples, the assistance data 330-a and 330-b may include an inter-UE coordination message, where a first UE 115 forwards sensing results to other UEs 115 and the other UEs 115 perform automatic gain control calibration and opportunistically decode the sensing results. Additionally or alternatively, the other UEs 115 may transmit resource recommendation to the first UE 115. In some examples, the assistance data 330-a and 330-b may include HARQ bits of all HARQ process. The assistance data 330-a and 330-b may include tracking reference signal or other reference signals allowing better synchronization to the UE or obtaining channel state information. In some examples, the assistance data 330-a and 330-b may include a detailed channel state information report (where a UE reports a detailed channel state information, such as pre-coding matrix and per-subchannel channel quality indication).

Figure 4:
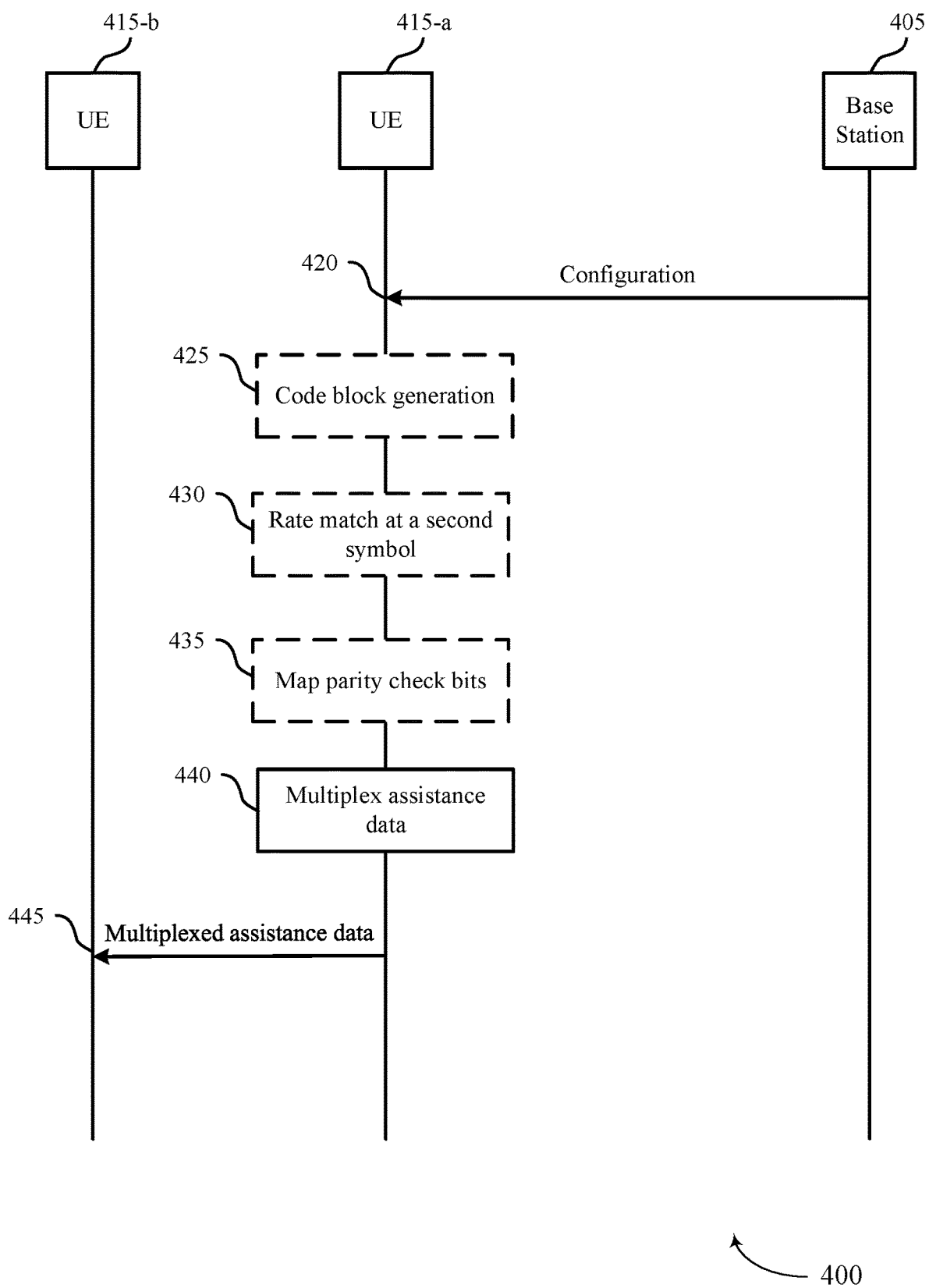
FIG. 4 illustrates an example of a process flow that supports rate matching on sidelink automatic gain control in accordance with one or more aspects of the present disclosure.

FIG. 4 illustrates an example of a process flow 400 that supports rate matching on sidelink automatic gain control in accordance with one or more aspects of the present disclosure. The process flow 400 may implement aspects of the wireless communications systems 100 and 200 or may be implemented by aspects of the wireless communications system 100 and 200 as described with reference to FIGS. 1 and 2, respectively. For example, the process flow 400 may be implemented by a UE 415-*a*, a UE 415-*b* and a base station 405 to support rate matching on sidelink automatic gain control to reduce power consumption, increase battery life, and reduce processing, spectral efficiency, and reliability. The process flow 400 may further be implemented by the UE 415-*a*, the UE 415-*b* and the base station 405 to increase coordination between devices, spectral efficiency, and data rates.

The base station 405 may be an example of a base station 105 as described with reference to FIGS. 1 and 2. The UE 415-*a* and the UE 415-*b* may be examples of a UE 115, as described with reference to FIGS. 1 and 2. In the following description of the process flow 400, the operations may be performed in different orders or at different times. Some operations may also be omitted from the process flow 400, and other operations may be added to the process flow 400.

At 420, the UE 415-*a* may receive a signal indicating a configuration for a symbol reserved for automatic gain control. In some examples, the base station 405 may determine the configuration for multiplexing assistance data with the symbol reserved for automatic gain control. The base station 405 may transmit the signal indicating the configuration for multiplexing the assistance data with the symbol reserved for automatic gain control.

At 425, the UE 415-*a* may optionally generate a code block for physical sidelink shared channel data based on mapping a low-density parity-check code to a circular buffer. In some examples, the UE 415-*a* may generate a code block for physical sidelink control channel data based on a polar code.

At 430, the UE 415-*a* may optionally rate match, at a second symbol subsequent to the symbol reserved for automatic gain control, one or more bits associated with the code block with a corresponding redundancy version. Additionally or alternatively, the UE 415-*a* may rate match, at a second symbol subsequent to the symbol reserved for automatic gain control, one or more bits associated with the code block.

At 435, the UE 415-*a* may optionally map one or more parity check bits associated with the code block to the symbol reserved for automatic gain control. In some examples, the UE 415-*a* may map one or more parity check bits associated with the code block to the symbol reserved for automatic gain control.

At 440, the UE 415-*a* may multiplex assistance data with the symbol reserved for automatic gain control based on the configuration for the symbol reserved for automatic gain control. In some examples, the UE 415-*a* may multiplex physical sidelink shared channel data with the symbol reserved for automatic gain control. Additionally or alternatively, the UE 415-*a* may multiplex physical sidelink control channel data with the symbol reserved for automatic gain control. In some examples, the UE 415-*a* may multiplex physical sidelink shared channel data and physical sidelink control channel data with the symbol reserved for automatic gain control.

At 445, the UE 415-*a* may transmit, to the UE 415-*b*, the multiplexed assistance data in the symbol reserved for automatic gain control. In some examples, assistance data may include at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

Figure 5:
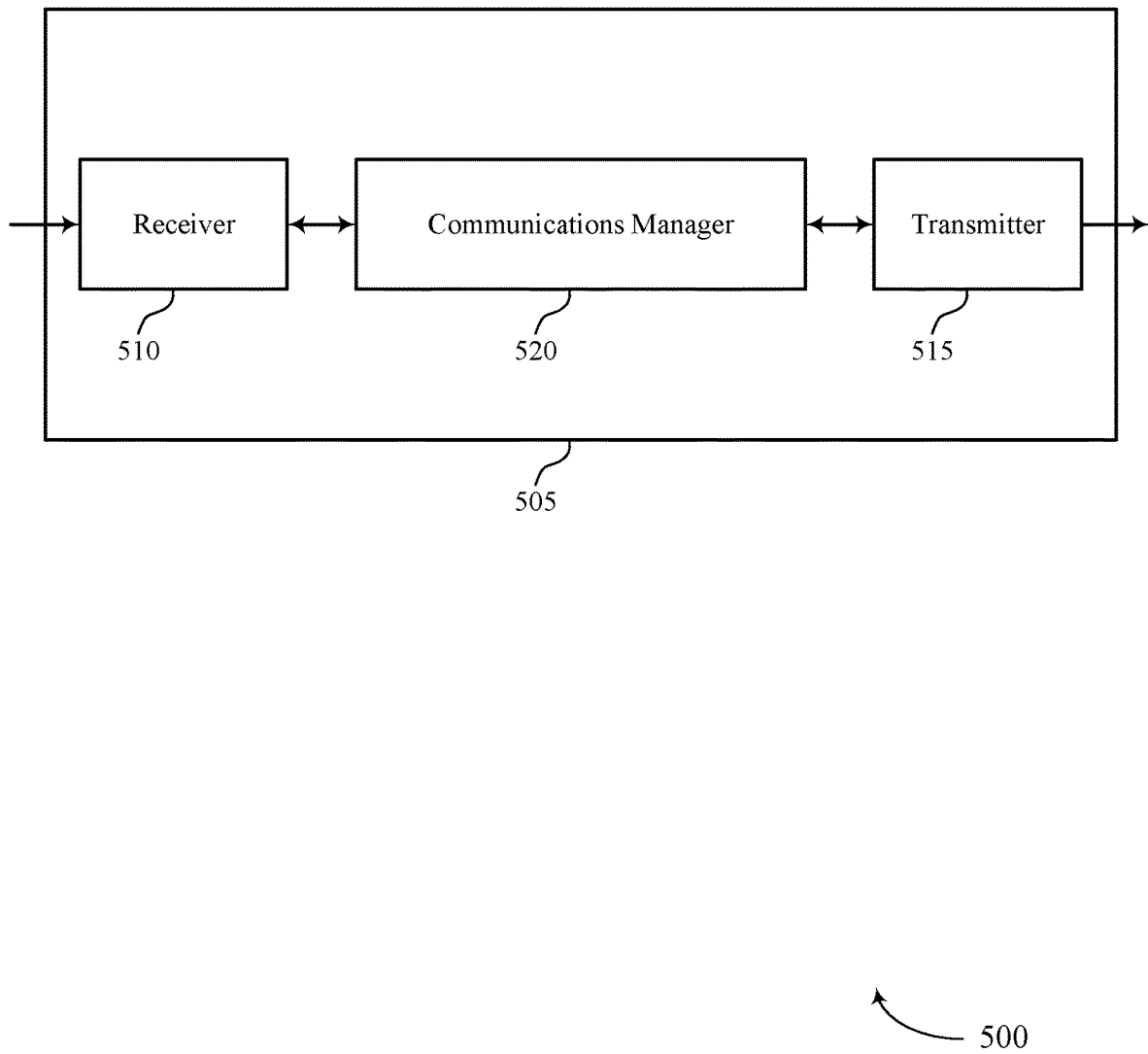
FIGS. 5 and 6 show block diagrams of devices that support rate matching on sidelink automatic gain control in accordance with one or more aspects of the present disclosure.

FIG. 5 shows a block diagram 500 of a device 505 that supports rate matching on sidelink automatic gain control in accordance with one or more aspects of the present disclosure. The device 505 may be an example of aspects of a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to rate matching on sidelink automatic gain control). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to rate matching on sidelink automatic gain control). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of rate matching on sidelink automatic gain control as described herein. For example, the communications manager 520, the receiver 510, the transmitter 515, or various combinations or components thereof may support a method for performing one or more of the functions described herein.

In some examples, the communications manager 520, the receiver 510, the transmitter 515, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled to the processor may be configured to perform one or more of the functions described herein (e.g., by executing, by the processor, instructions stored in the memory).

Additionally or alternatively, in some examples, the communications manager 520, the receiver 510, the transmitter 515, or various combinations or components thereof may be implemented in code (e.g., as communications management software or firmware) executed by a processor. If implemented in code executed by a processor, the functions of the communications manager 520, the receiver 510, the transmitter 515, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 520 may be configured to perform various operations (e.g., receiving, monitoring, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to receive information, transmit information, or perform various other operations as described herein.

The communications manager 520 may support wireless communication at a UE in accordance with examples as disclosed herein. For example, the communications manager 520 may be configured as or otherwise support a means for receiving a signal indicating a configuration for a symbol reserved for automatic gain control. The communications manager 520 may be configured as or otherwise support a means for multiplexing, based on the configuration for the symbol reserved for automatic gain control, assistance data with the symbol reserved for automatic gain control. The communications manager 520 may be configured as or otherwise support a means for transmitting the multiplexed assistance data in the symbol reserved for automatic gain control.

By including or configuring the communications manager 520 in accordance with examples as described herein, the device 505 (e.g., a processor controlling or otherwise coupled to the receiver 510, the transmitter 515, the communications manager 520, or a combination thereof) may support techniques for reduced processing, reduced power consumption, and more efficient utilization of communication resources.

Figure 6:
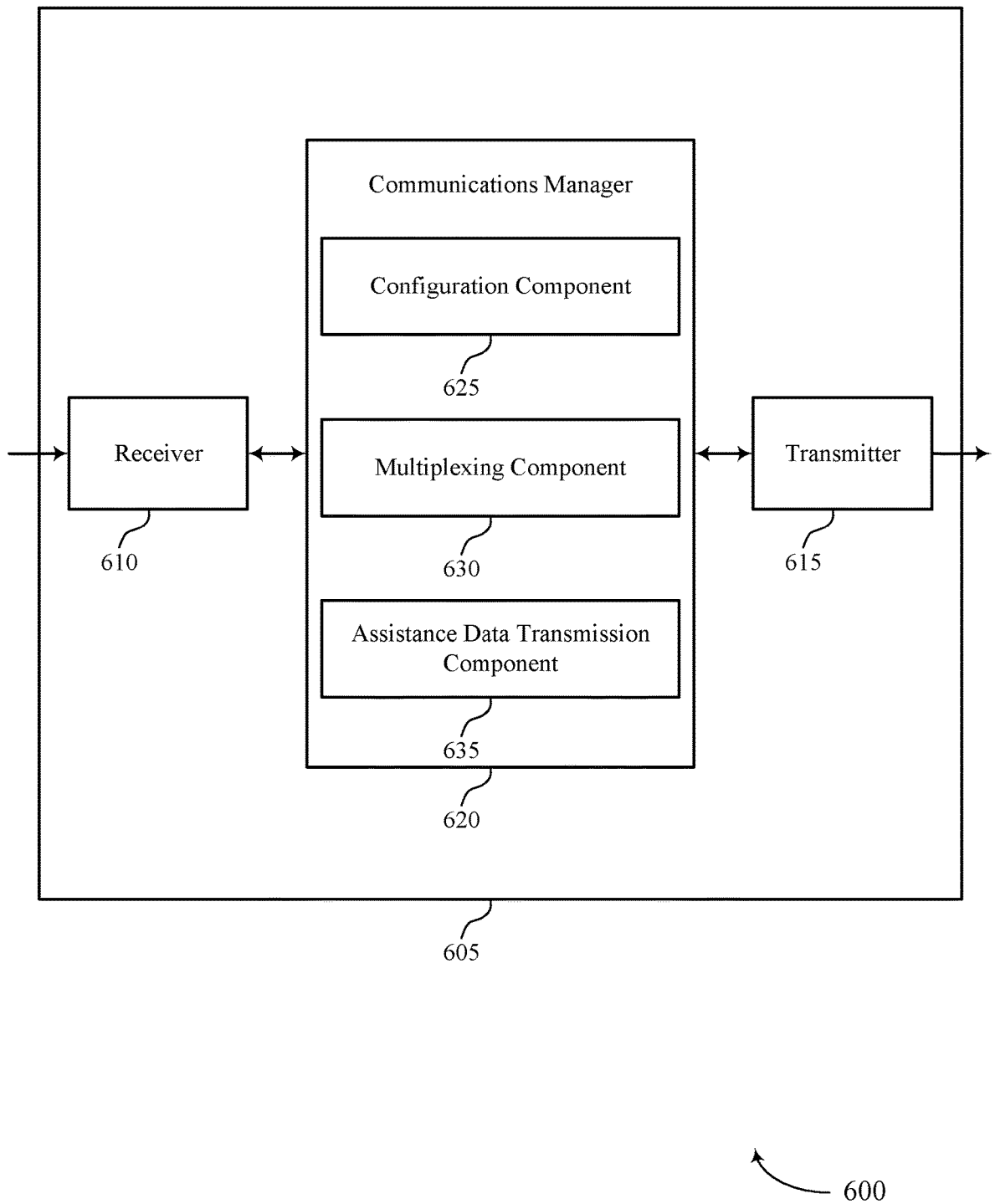

FIG. 6 shows a block diagram 600 of a device 605 that supports rate matching on sidelink automatic gain control in accordance with one or more aspects of the present disclosure. The device 605 may be an example of aspects of a device 505 or a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to rate matching on sidelink automatic gain control). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to rate matching on sidelink automatic gain control). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of rate matching on sidelink automatic gain control as described herein. For example, the communications manager 620 may include a configuration component 625, a multiplexing component 630, an assistance data transmission component 635, or any combination thereof. The communications manager 620 may be an example of aspects of a communications manager 520 as described herein. In some examples, the communications manager 620, or various components thereof, may be configured to perform various operations (e.g., receiving, monitoring, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to receive information, transmit information, or perform various other operations as described herein.

The communications manager 620 may support wireless communication at a UE in accordance with examples as disclosed herein. The configuration component 625 may be configured as or otherwise support a means for receiving a signal indicating a configuration for a symbol reserved for automatic gain control. The multiplexing component 630 may be configured as or otherwise support a means for multiplexing, based on the configuration for the symbol reserved for automatic gain control, assistance data with the symbol reserved for automatic gain control. The assistance data transmission component 635 may be configured as or otherwise support a means for transmitting the multiplexed assistance data in the symbol reserved for automatic gain control.

Figure 7:
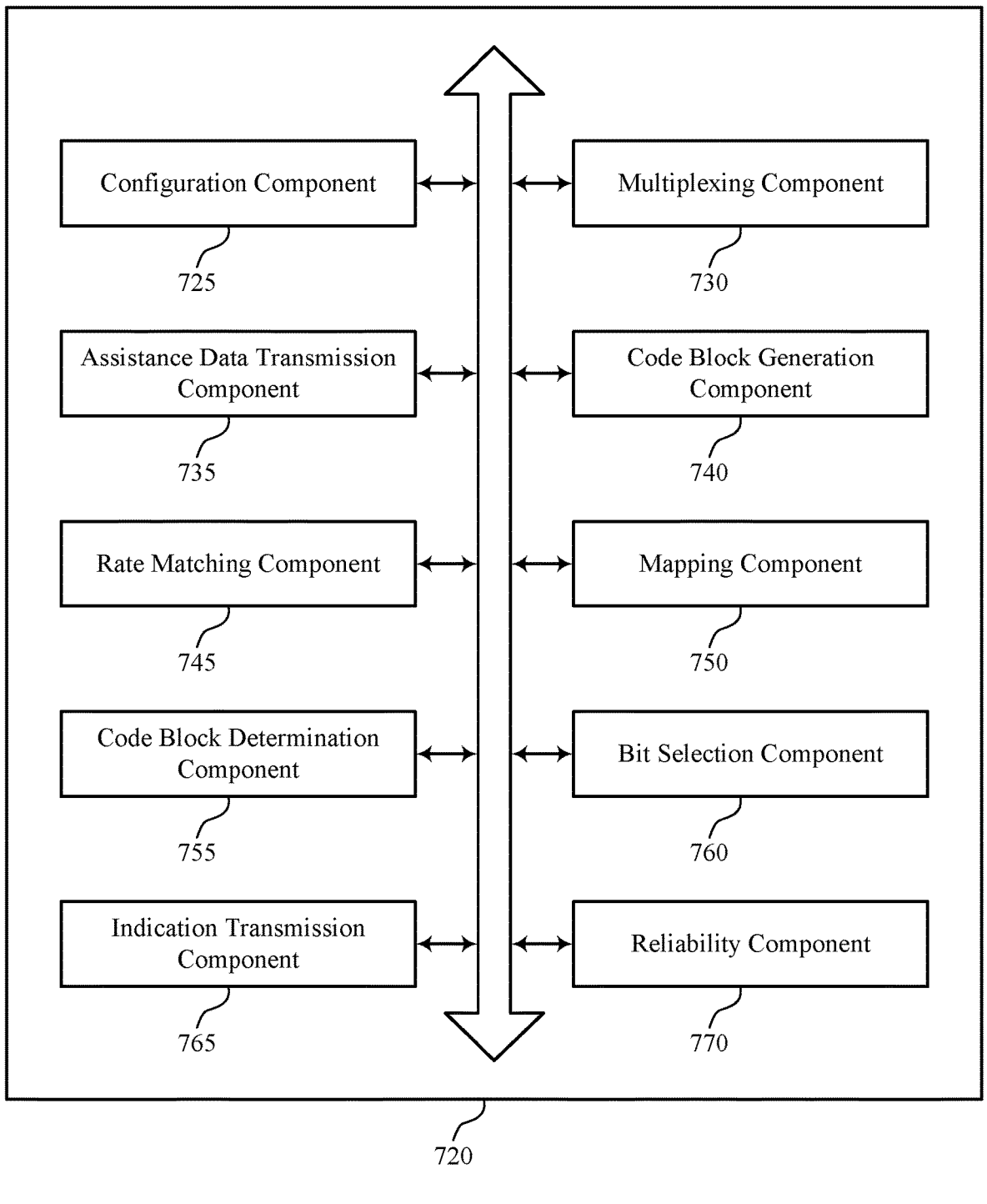
FIG. 7 shows a block diagram of a communications manager that supports rate matching on sidelink automatic gain control in accordance with one or more aspects of the present disclosure.

FIG. 7 shows a block diagram 700 of a communications manager 720 that supports rate matching on sidelink automatic gain control in accordance with one or more aspects of the present disclosure. The communications manager 720 may be an example of aspects of a communications manager 520, a communications manager 620, or both, as described herein. The communications manager 720, or various components thereof, may be an example of means for performing various aspects of rate matching on sidelink automatic gain control as described herein. For example, the communications manager 720 may include a configuration component 725, a multiplexing component 730, an assistance data transmission component 735, a code block generation component 740, a rate matching component 745, a mapping component 750, a code block determination component 755, a bit selection component 760, an indication transmission component 765, a reliability component 770, or any combination thereof. Each of these components may communicate, directly or indirectly, with one another (e.g., via one or more buses).

The communications manager 720 may support wireless communication at a UE in accordance with examples as disclosed herein. The configuration component 725 may be configured as or otherwise support a means for receiving a signal indicating a configuration for a symbol reserved for automatic gain control. The multiplexing component 730 may be configured as or otherwise support a means for multiplexing, based on the configuration for the symbol reserved for automatic gain control, assistance data with the symbol reserved for automatic gain control. The assistance data transmission component 735 may be configured as or otherwise support a means for transmitting the multiplexed assistance data in the symbol reserved for automatic gain control.

In some examples, the multiplexing component 730 may be configured as or otherwise support a means for multiplexing, based on the configuration for the symbol reserved for automatic gain control, physical sidelink shared channel data with the symbol reserved for automatic gain control. In some examples, the multiplexing component 730 may be configured as or otherwise support a means for multiplexing, based on the configuration for the symbol reserved for automatic gain control, physical sidelink control channel data with the symbol reserved for automatic gain control.

In some examples, the multiplexing component 730 may be configured as or otherwise support a means for multiplexing, based on the configuration for the symbol reserved for automatic gain control, physical sidelink shared channel data and physical sidelink control channel data with the symbol reserved for automatic gain control.

In some examples, the code block generation component 740 may be configured as or otherwise support a means for generating a code block for physical sidelink shared channel data based on mapping a low-density parity-check code to a circular buffer. In some examples, the rate matching component 745 may be configured as or otherwise support a means for rate matching, at a second symbol subsequent to the symbol reserved for automatic gain control, one or more bits associated with the code block with a corresponding redundancy version. In some examples, the mapping component 750 may be configured as or otherwise support a means for mapping one or more parity check bits associated with the code block to the symbol reserved for automatic gain control.

In some examples, the code block generation component 740 may be configured as or otherwise support a means for generating a code block for physical sidelink control channel data based on a polar code. In some examples, the rate matching component 745 may be configured as or otherwise support a means for rate matching, at a second symbol subsequent to the symbol reserved for automatic gain control, one or more bits associated with the code block. In some examples, the mapping component 750 may be configured as or otherwise support a means for mapping one or more parity check bits associated with the code block to the symbol reserved for automatic gain control.

In some examples, a size of the code block is based on a size of a sidelink control information resource and a size of an automatic gain control resource. In some examples, the code block determination component 755 may be configured as or otherwise support a means for determining a first set of multiple code blocks included in a transport block and a second set of multiple bits associated with the symbol reserved for automatic gain control. In some examples, the bit selection component 760 may be configured as or otherwise support a means for selecting one or more bits associated with the assistance data based on the first set of multiple code blocks included in the transport block and the second set of multiple bits associated with the symbol reserved for automatic gain control.

In some examples, the bit selection component 760 may be configured as or otherwise support a means for selecting an equal number of bits for each code block of the first set of multiple code blocks. In some examples, mapping a remaining number of bits to the symbol reserved for automatic gain control.

In some examples, the bit selection component 760 may be configured as or otherwise support a means for selecting one or more bits associated with the assistance data based on a code block associated with the one or more bits and a demodulation reference signal. In some examples, the bit selection component 760 may be configured as or otherwise support a means for selecting one or more bits associated with the assistance data based on a priority of a code block associated with the one or more bits. In some examples, the code block is associated with an uplink control information or a MAC control element or both.

In some examples, the bit selection component 760 may be configured as or otherwise support a means for selecting one or more bits associated with the assistance data based on a set of multiple code blocks, where the one or more bits are selected uniformly or non-uniformly for the set of multiple code blocks.

In some examples, the indication transmission component 765 may be configured as or otherwise support a means for transmitting an indication of selection of the set of multiple code blocks based on selecting the one or more bits associated with the assistance data. In some examples, the indication of the selection includes an indication of uniform selection or an indication of non-uniform selection or both.

In some examples, the indication of the selection includes at least one of a first sidelink control information format, a second sidelink control information format, a MAC control element, a radio resource control, or a combination thereof.

In some examples, the reliability component 770 may be configured as or otherwise support a means for receiving a request to increase reliability associated with the set of multiple code blocks, where selecting the one or more bits associated with the assistance data is based on the request. In some examples, the assistance data includes at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

Figure 8:
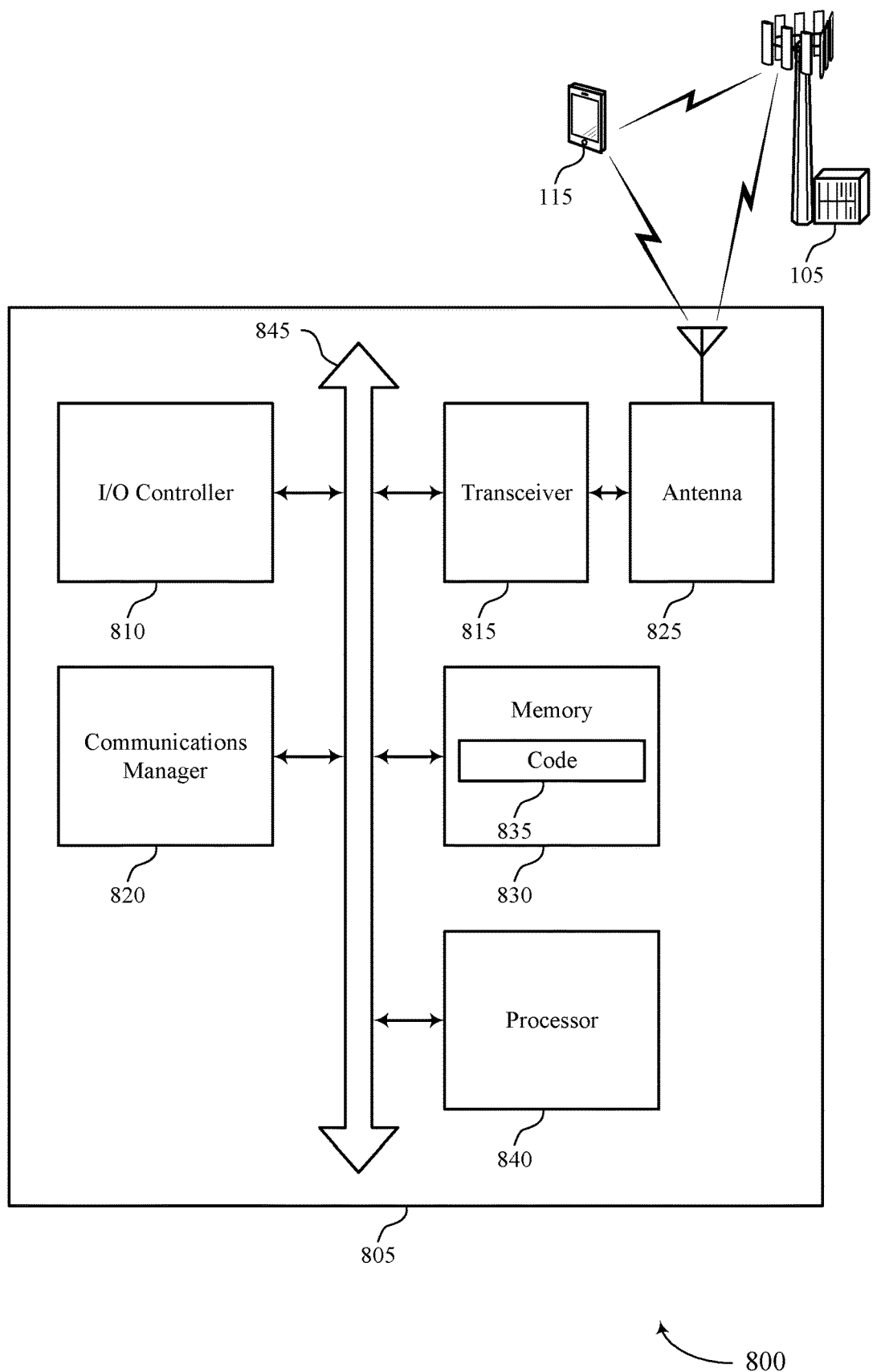
FIG. 8 shows a diagram of a system including a device that supports rate matching on sidelink automatic gain control in accordance with one or more aspects of the present disclosure.

FIG. 8 shows a diagram of a system 800 including a device 805 that supports rate matching on sidelink automatic gain control in accordance with one or more aspects of the present disclosure. The device 805 may be an example of or include the components of a device 505, a device 605, or a UE 115 as described herein. The device 805 may communicate wirelessly with one or more base stations 105, UEs 115, or any combination thereof. The device 805 may include components for bi-directional voice and data communications including components for transmitting and receiving communications, such as a communications manager 820, an input/output (I/O) controller 810, a transceiver 815, an antenna 825, a memory 830, code 835, and a processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally or alternatively, the I/O controller 810 may represent or interact with a modem, a keyboard, a mouse, a touchscreen, or a similar device. In some cases, the I/O controller 810 may be implemented as part of a processor, such as the processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The memory 830 may include random access memory (RAM) and read-only memory (ROM). The memory 830 may store computer-readable, computer-executable code 835 including instructions that, when executed by the processor 840, cause the device 805 to perform various functions described herein. The code 835 may be stored in a non-transitory computer-readable medium such as system memory or another type of memory. In some cases, the code 835 may not be directly executable by the processor 840 but may cause a computer (e.g., when compiled and executed) to perform functions described herein. In some cases, the memory 830 may contain, among other things, a basic I/O system (BIOS) which may control basic hardware or software operation such as the interaction with peripheral components or devices.

The processor 840 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In some other cases, a memory controller may be integrated into the processor 840. The processor 840 may be configured to execute computer-readable instructions stored in a memory (e.g., the memory 830) to cause the device 805 to perform various functions (e.g., functions or tasks supporting rate matching on sidelink automatic gain control). For example, the device 805 or a component of the device 805 may include a processor 840 and memory 830 coupled to the processor 840, the processor 840 and memory 830 configured to perform various functions described herein.

The communications manager 820 may support wireless communication at a UE in accordance with examples as disclosed herein. For example, the communications manager 820 may be configured as or otherwise support a means for receiving a signal indicating a configuration for a symbol reserved for automatic gain control. The communications manager 820 may be configured as or otherwise support a means for multiplexing, based on the configuration for the symbol reserved for automatic gain control, assistance data with the symbol reserved for automatic gain control. The communications manager 820 may be configured as or otherwise support a means for transmitting the multiplexed assistance data in the symbol reserved for automatic gain control.

By including or configuring the communications manager 820 in accordance with examples as described herein, the device 805 may support techniques for reduced latency, reduced processing, reduced power consumption, more efficient utilization of communication resources, and enhanced utilization of processing capability.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the processor 840, the memory 830, the code 835, or any combination thereof. For example, the code 835 may include instructions executable by the processor 840 to cause the device 805 to perform various aspects of rate matching on sidelink automatic gain control as described herein, or the processor 840 and the memory 830 may be otherwise configured to perform or support such operations.

Figure 9:
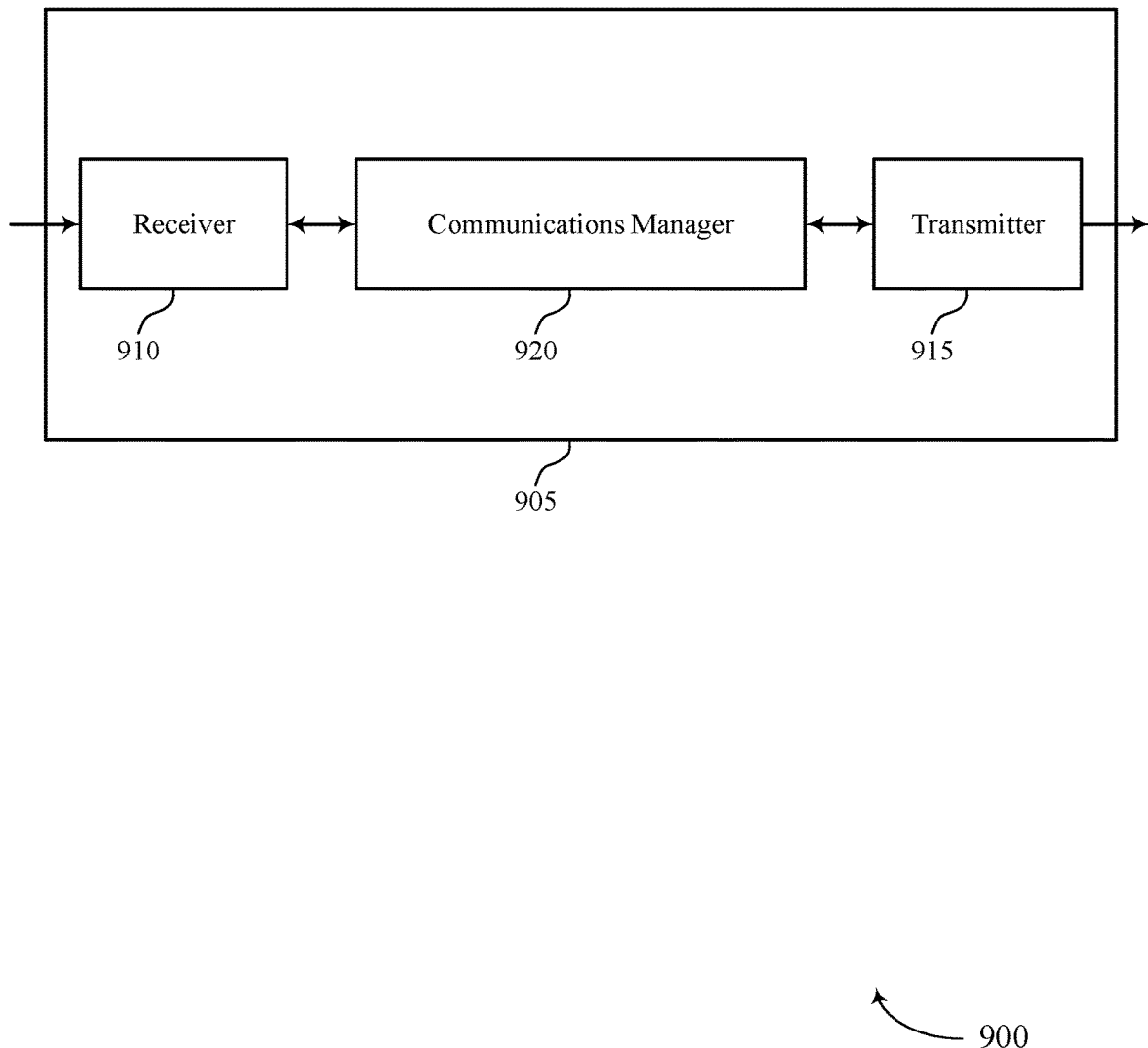
FIGS. 9 and 10 show block diagrams of devices that support rate matching on sidelink automatic gain control in accordance with one or more aspects of the present disclosure.

FIG. 9 shows a block diagram 900 of a device 905 that supports rate matching on sidelink automatic gain control in accordance with one or more aspects of the present disclosure. The device 905 may be an example of aspects of a base station 105 as described herein. The device 905 may include a receiver 910, a transmitter 915, and a communications manager 920. The device 905 may also include a processor. Each of these components may be in communication with one another (e.g., via one or more buses).

The receiver 910 may provide a means for receiving information such as packets, user data, control information, or any combination thereof associated with various information channels (e.g., control channels, data channels, information channels related to rate matching on sidelink automatic gain control). Information may be passed on to other components of the device 905. The receiver 910 may utilize a single antenna or a set of multiple antennas.

The transmitter 915 may provide a means for transmitting signals generated by other components of the device 905. For example, the transmitter 915 may transmit information such as packets, user data, control information, or any combination thereof associated with various information channels (e.g., control channels, data channels, information channels related to rate matching on sidelink automatic gain control). In some examples, the transmitter 915 may be co-located with a receiver 910 in a transceiver module. The transmitter 915 may utilize a single antenna or a set of multiple antennas.

The communications manager 920, the receiver 910, the transmitter 915, or various combinations thereof or various components thereof may be examples of means for performing various aspects of rate matching on sidelink automatic gain control as described herein. For example, the communications manager 920, the receiver 910, the transmitter 915, or various combinations or components thereof may support a method for performing one or more of the functions described herein.

In some examples, the communications manager 920, the receiver 910, the transmitter 915, or various combinations or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled to the processor may be configured to perform one or more of the functions described herein (e.g., by executing, by the processor, instructions stored in the memory).

Additionally or alternatively, in some examples, the communications manager 920, the receiver 910, the transmitter 915, or various combinations or components thereof may be implemented in code (e.g., as communications management software or firmware) executed by a processor. If implemented in code executed by a processor, the functions of the communications manager 920, the receiver 910, the transmitter 915, or various combinations or components thereof may be performed by a general-purpose processor, a DSP, a CPU, an ASIC, an FPGA, or any combination of these or other programmable logic devices (e.g., configured as or otherwise supporting a means for performing the functions described in the present disclosure).

In some examples, the communications manager 920 may be configured to perform various operations (e.g., receiving, monitoring, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to receive information, transmit information, or perform various other operations as described herein.

The communications manager 920 may support wireless communication at a base station in accordance with examples as disclosed herein. For example, the communications manager 920 may be configured as or otherwise support a means for determining a configuration for multiplexing assistance data with a symbol reserved for automatic gain control. The communications manager 920 may be configured as or otherwise support a means for transmitting, to a UE, a signal indicating the configuration for multiplexing the assistance data with the symbol reserved for automatic gain control.

By including or configuring the communications manager 920 in accordance with examples as described herein, the device 905 (e.g., a processor controlling or otherwise coupled to the receiver 910, the transmitter 915, the communications manager 920, or a combination thereof) may support techniques for reduced processing, reduced power consumption, and more efficient utilization of communication resources.

Figure 10:
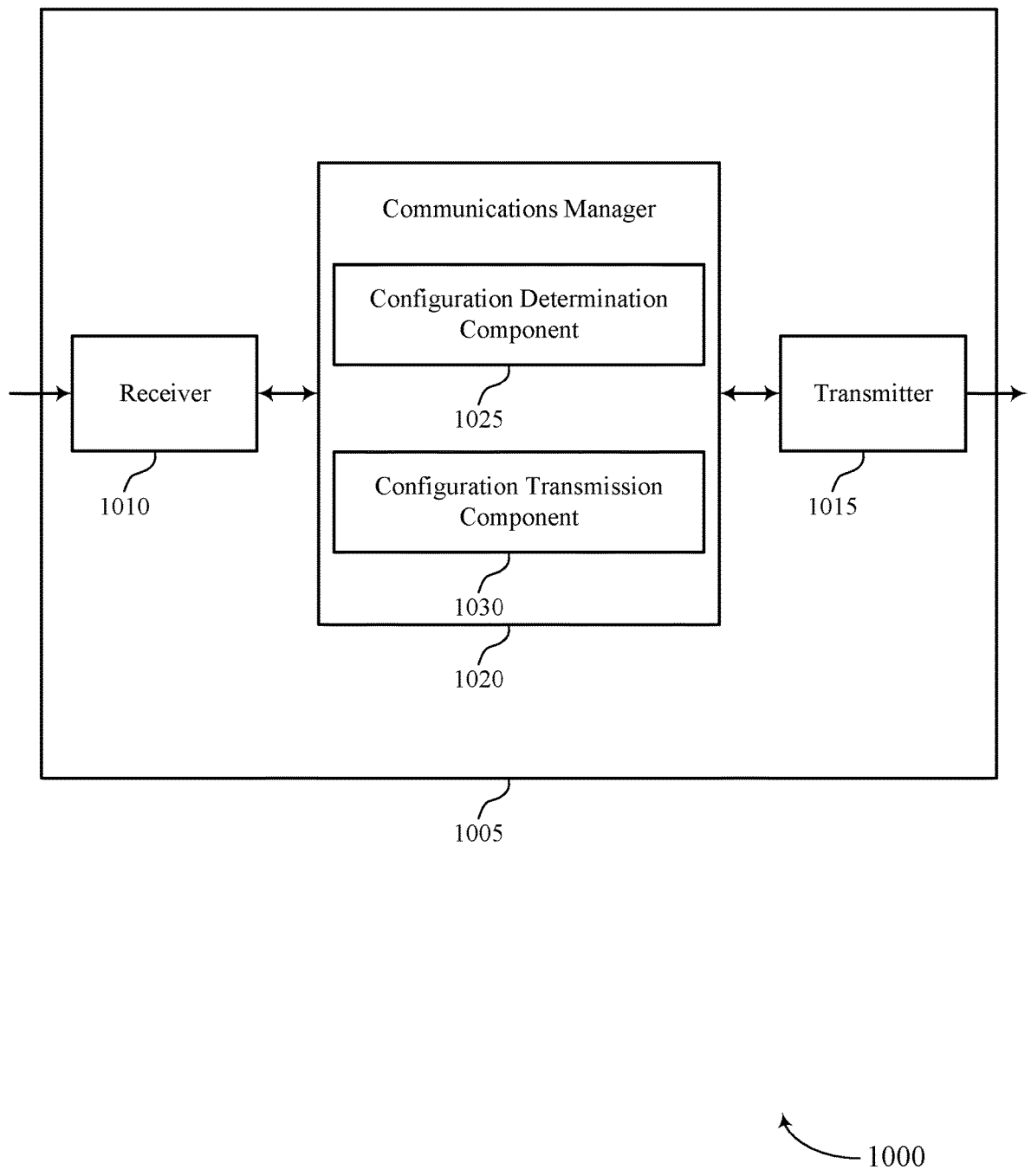

FIG. 10 shows a block diagram 1000 of a device 1005 that supports rate matching on sidelink automatic gain control in accordance with one or more aspects of the present disclosure. The device 1005 may be an example of aspects of a device 905 or a base station 105 as described herein. The device 1005 may include a receiver 1010, a transmitter 1015, and a communications manager 1020. The device 1005 may also include a processor. Each of these components may be in communication with one another (e.g., via one or more buses).

The receiver 1010 may provide a means for receiving information such as packets, user data, control information, or any combination thereof associated with various information channels (e.g., control channels, data channels, information channels related to rate matching on sidelink automatic gain control). Information may be passed on to other components of the device 1005. The receiver 1010 may utilize a single antenna or a set of multiple antennas.

The transmitter 1015 may provide a means for transmitting signals generated by other components of the device 1005. For example, the transmitter 1015 may transmit information such as packets, user data, control information, or any combination thereof associated with various information channels (e.g., control channels, data channels, information channels related to rate matching on sidelink automatic gain control). In some examples, the transmitter 1015 may be co-located with a receiver 1010 in a transceiver module. The transmitter 1015 may utilize a single antenna or a set of multiple antennas.

The device 1005, or various components thereof, may be an example of means for performing various aspects of rate matching on sidelink automatic gain control as described herein. For example, the communications manager 1020 may include a configuration determination component 1025 a configuration transmission component 1030, or any combination thereof. The communications manager 1020 may be an example of aspects of a communications manager 920 as described herein. In some examples, the communications manager 1020, or various components thereof, may be configured to perform various operations (e.g., receiving, monitoring, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to receive information, transmit information, or perform various other operations as described herein.

The communications manager 1020 may support wireless communication at a base station in accordance with examples as disclosed herein. The configuration determination component 1025 may be configured as or otherwise support a means for determining a configuration for multiplexing assistance data with a symbol reserved for automatic gain control. The configuration transmission component 1030 may be configured as or otherwise support a means for transmitting, to a UE, a signal indicating the configuration for multiplexing the assistance data with the symbol reserved for automatic gain control.

Figure 11:
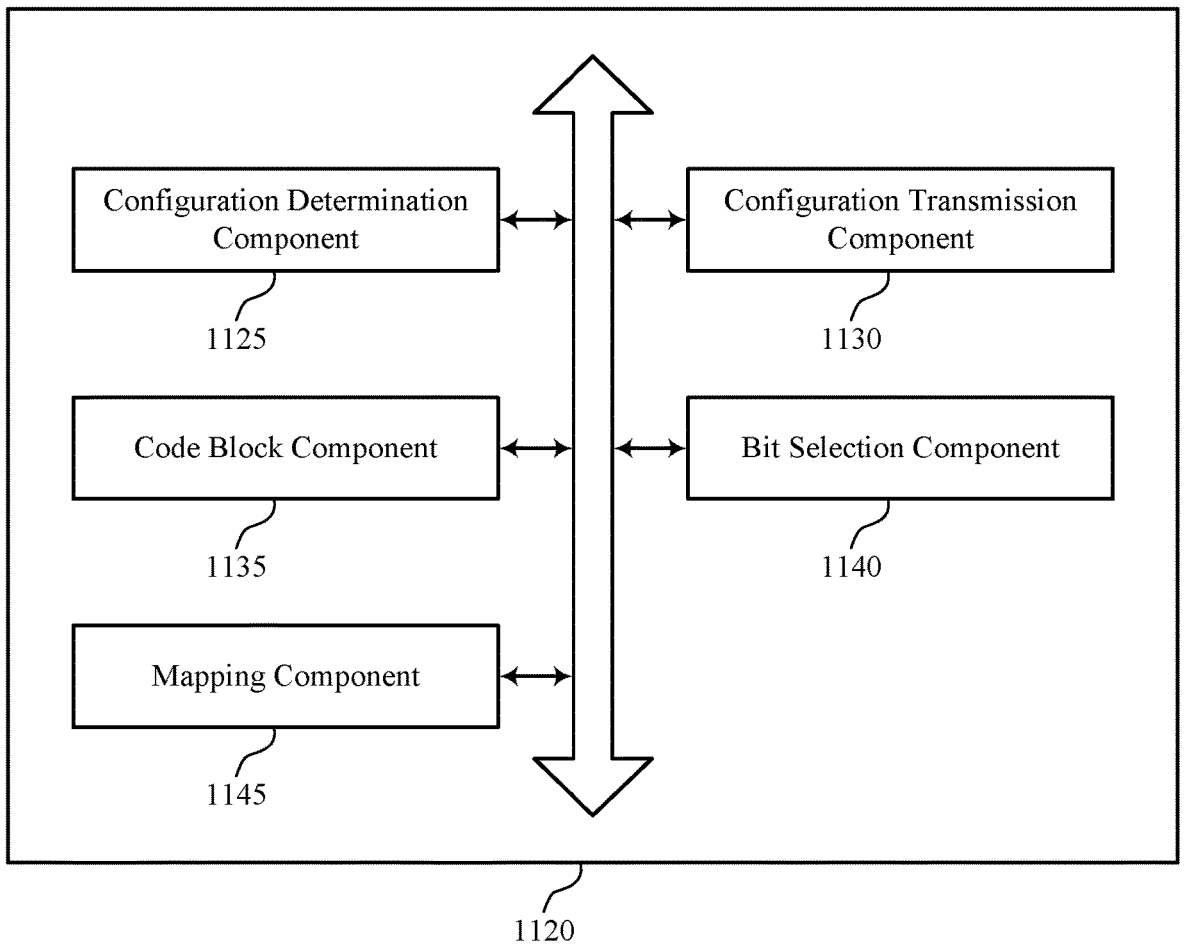
FIG. 11 shows a block diagram of a communications manager that supports rate matching on sidelink automatic gain control in accordance with one or more aspects of the present disclosure.

FIG. 11 shows a block diagram 1100 of a communications manager 1120 that supports rate matching on sidelink automatic gain control in accordance with one or more aspects of the present disclosure. The communications manager 1120 may be an example of aspects of a communications manager 920, a communications manager 1020, or both, as described herein. The communications manager 1120, or various components thereof, may be an example of means for performing various aspects of rate matching on sidelink automatic gain control as described herein. For example, the communications manager 1120 may include a configuration determination component 1125, a configuration transmission component 1130, a code block component 1135, a bit selection component 1140, a mapping component 1145, or any combination thereof. Each of these components may communicate, directly or indirectly, with one another (e.g., via one or more buses).

The communications manager 1120 may support wireless communication at a base station in accordance with examples as disclosed herein. The configuration determination component 1125 may be configured as or otherwise support a means for determining a configuration for multiplexing assistance data with a symbol reserved for automatic gain control. The configuration transmission component 1130 may be configured as or otherwise support a means for transmitting, to a UE, a signal indicating the configuration for multiplexing the assistance data with the symbol reserved for automatic gain control.

In some examples, the configuration determination component 1125 may be configured as or otherwise support a means for determining the configuration for multiplexing physical sidelink shared channel data with the symbol reserved for automatic gain control. In some examples, the configuration determination component 1125 may be configured as or otherwise support a means for determining the configuration for multiplexing physical sidelink control channel data with the symbol reserved for automatic gain control. In some examples, the configuration determination component 1125 may be configured as or otherwise support a means for determining the configuration for multiplexing physical sidelink shared channel data and physical sidelink control channel data with the symbol reserved for automatic gain control.

In some examples, the code block component 1135 may be configured as or otherwise support a means for determining a first set of multiple code blocks included in a transport block and a second set of multiple bits associated with the symbol reserved for automatic gain control. In some examples, the bit selection component 1140 may be configured as or otherwise support a means for configuring the UE to select one or more bits associated with the assistance data based on the first set of multiple code blocks included in the transport block and the second set of multiple bits associated with the symbol reserved for automatic gain control.

In some examples, the bit selection component 1140 may be configured as or otherwise support a means for configuring the UE to select an equal number of bits for each code block of the first set of multiple code blocks. In some examples, the bit mapping component 1145 may be configured as or otherwise support a means for configuring the UE to map a remaining number of bits to the symbol reserved for automatic gain control.

In some examples, the bit selection component 1140 may be configured as or otherwise support a means for configuring the UE to select one or more bits associated with the assistance data based on a code block associated with the one or more bits and a demodulation reference signal.

In some examples, the bit selection component 1140 may be configured as or otherwise support a means for configuring the UE to select one or more bits associated with the assistance data based on a priority of a code block associated with the one or more bits. In some examples, the code block is associated with an uplink control information or a MAC control element or both.

In some examples, the assistance data includes at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

Figure 12:
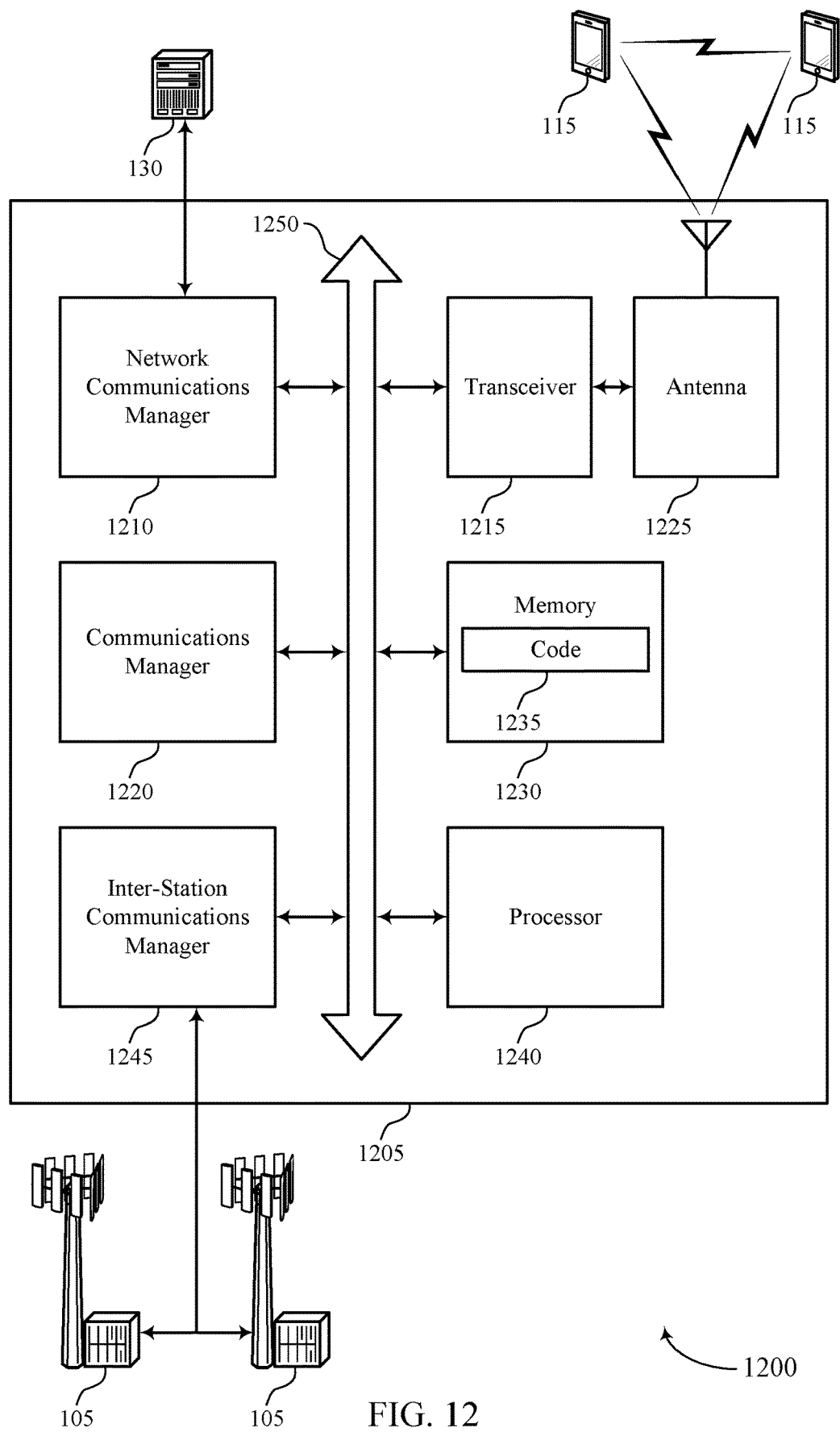
FIG. 12 shows a diagram of a system including a device that supports rate matching on sidelink automatic gain control in accordance with one or more aspects of the present disclosure.

FIG. 12 shows a diagram of a system 1200 including a device 1205 that supports rate matching on sidelink automatic gain control in accordance with one or more aspects of the present disclosure. The device 1205 may be an example of or include the components of a device 905, a device 1005, or a base station 105 as described herein. The device 1205 may communicate wirelessly with one or more base stations 105, UEs 115, or any combination thereof. The device 1205 may include components for bi-directional voice and data communications including components for transmitting and receiving communications, such as a communications manager 1220, a network communications manager 1210, a transceiver 1215, an antenna 1225, a memory 1230, code 1235, a processor 1240, and an inter-station communications manager 1245. These components may be in electronic communication or otherwise coupled (e.g., operatively, communicatively, functionally, electronically, electrically) via one or more buses (e.g., a bus 1250).

The network communications manager 1210 may manage communications with a core network 130 (e.g., via one or more wired backhaul links). For example, the network communications manager 1210 may manage the transfer of data communications for client devices, such as one or more UEs 115.

In some cases, the device 1205 may include a single antenna 1225. However, in some other cases the device 1205 may have more than one antenna 1225, which may be capable of concurrently transmitting or receiving multiple wireless transmissions. The transceiver 1215 may communicate bi-directionally, via the one or more antennas 1225, wired, or wireless links as described herein. For example, the transceiver 1215 may represent a wireless transceiver and may communicate bi-directionally with another wireless transceiver. The transceiver 1215 may also include a modem to modulate the packets, to provide the modulated packets to one or more antennas 1225 for transmission, and to demodulate packets received from the one or more antennas 1225. The transceiver 1215, or the transceiver 1215 and one or more antennas 1225, may be an example of a transmitter 915, a transmitter 1015, a receiver 910, a receiver 1010, or any combination thereof or component thereof, as described herein.

The memory 1230 may include RAM and ROM. The memory 1230 may store computer-readable, computer-executable code 1235 including instructions that, when executed by the processor 1240, cause the device 1205 to perform various functions described herein. The code 1235 may be stored in a non-transitory computer-readable medium such as system memory or another type of memory. In some cases, the code 1235 may not be directly executable by the processor 1240 but may cause a computer (e.g., when compiled and executed) to perform functions described herein. In some cases, the memory 1230 may contain, among other things, a BIOS which may control basic hardware or software operation such as the interaction with peripheral components or devices.

The processor 1240 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1240 may be configured to operate a memory array using a memory controller. In some other cases, a memory controller may be integrated into the processor 1240. The processor 1240 may be configured to execute computer-readable instructions stored in a memory (e.g., the memory 1230) to cause the device 1205 to perform various functions (e.g., functions or tasks supporting rate matching on sidelink automatic gain control). For example, the device 1205 or a component of the device 1205 may include a processor 1240 and memory 1230 coupled to the processor 1240, the processor 1240 and memory 1230 configured to perform various functions described herein.

The inter-station communications manager 1245 may manage communications with other base stations 105, and may include a controller or scheduler for controlling communications with UEs 115 in cooperation with other base stations 105. For example, the inter-station communications manager 1245 may coordinate scheduling for transmissions to UEs 115 for various interference mitigation techniques such as beamforming or joint transmission. In some examples, the inter-station communications manager 1245 may provide an X2 interface within an LTE/LTE-A wireless communications network technology to provide communication between base stations 105.

The communications manager 1220 may support wireless communication at a base station in accordance with examples as disclosed herein. For example, the communications manager 1220 may be configured as or otherwise support a means for determining a configuration for multiplexing assistance data with a symbol reserved for automatic gain control. The communications manager 1220 may be configured as or otherwise support a means for transmitting, to a UE, a signal indicating the configuration for multiplexing the assistance data with the symbol reserved for automatic gain control.

By including or configuring the communications manager 1220 in accordance with examples as described herein, the device 1205 may support techniques for communication reliability, reduced latency, reduced processing, reduced power consumption, improved coordination between devices, and utilization of processing capability.

In some examples, the communications manager 1220 may be configured to perform various operations (e.g., receiving, monitoring, transmitting) using or otherwise in cooperation with the transceiver 1215, the one or more antennas 1225, or any combination thereof. Although the communications manager 1220 is illustrated as a separate component, in some examples, one or more functions described with reference to the communications manager 1220 may be supported by or performed by the processor 1240, the memory 1230, the code 1235, or any combination thereof. For example, the code 1235 may include instructions executable by the processor 1240 to cause the device 1205 to perform various aspects of rate matching on sidelink automatic gain control as described herein, or the processor 1240 and the memory 1230 may be otherwise configured to perform or support such operations.

Figure 13:
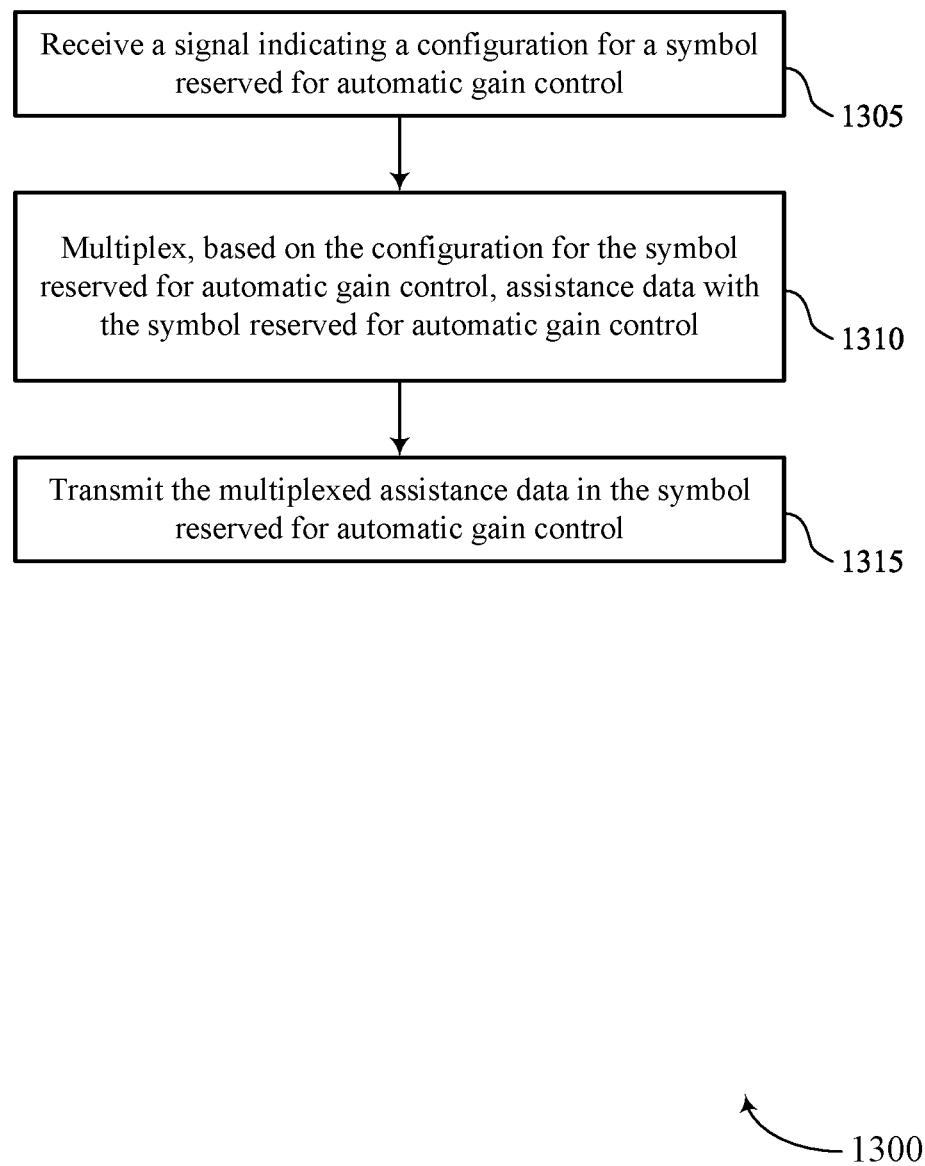
FIGS. 13 through 16 show flowcharts illustrating methods that support rate matching on sidelink automatic gain control in accordance with one or more aspects of the present disclosure.

FIG. 13 shows a flowchart illustrating a method 1300 that supports rate matching on sidelink automatic gain control in accordance with one or more aspects of the present disclosure. The operations of the method 1300 may be implemented by a UE or its components as described herein. For example, the operations of the method 1300 may be performed by a UE 115 as described with reference to FIGS. 1 through 8. In some examples, a UE may execute a set of instructions to control the functional elements of the UE to perform the described functions. Additionally or alternatively, the UE may perform aspects of the described functions using special-purpose hardware.

At 1305, the method may include receiving a signal indicating a configuration for a symbol reserved for automatic gain control. The operations of 1305 may be performed in accordance with examples as disclosed herein. In some examples, aspects of the operations of 1305 may be performed by a configuration component 725 as described with reference to FIG. 7.

At 1310, the method may include multiplexing, based on the configuration for the symbol reserved for automatic gain control, assistance data with the symbol reserved for automatic gain control. The operations of 1310 may be performed in accordance with examples as disclosed herein. In some examples, aspects of the operations of 1310 may be performed by a multiplexing component 730 as described with reference to FIG. 7.

At 1315, the method may include transmitting the multiplexed assistance data in the symbol reserved for automatic gain control. The operations of 1315 may be performed in accordance with examples as disclosed herein. In some examples, aspects of the operations of 1315 may be performed by an assistance data transmission component 735 as described with reference to FIG. 7.

Figure 14:
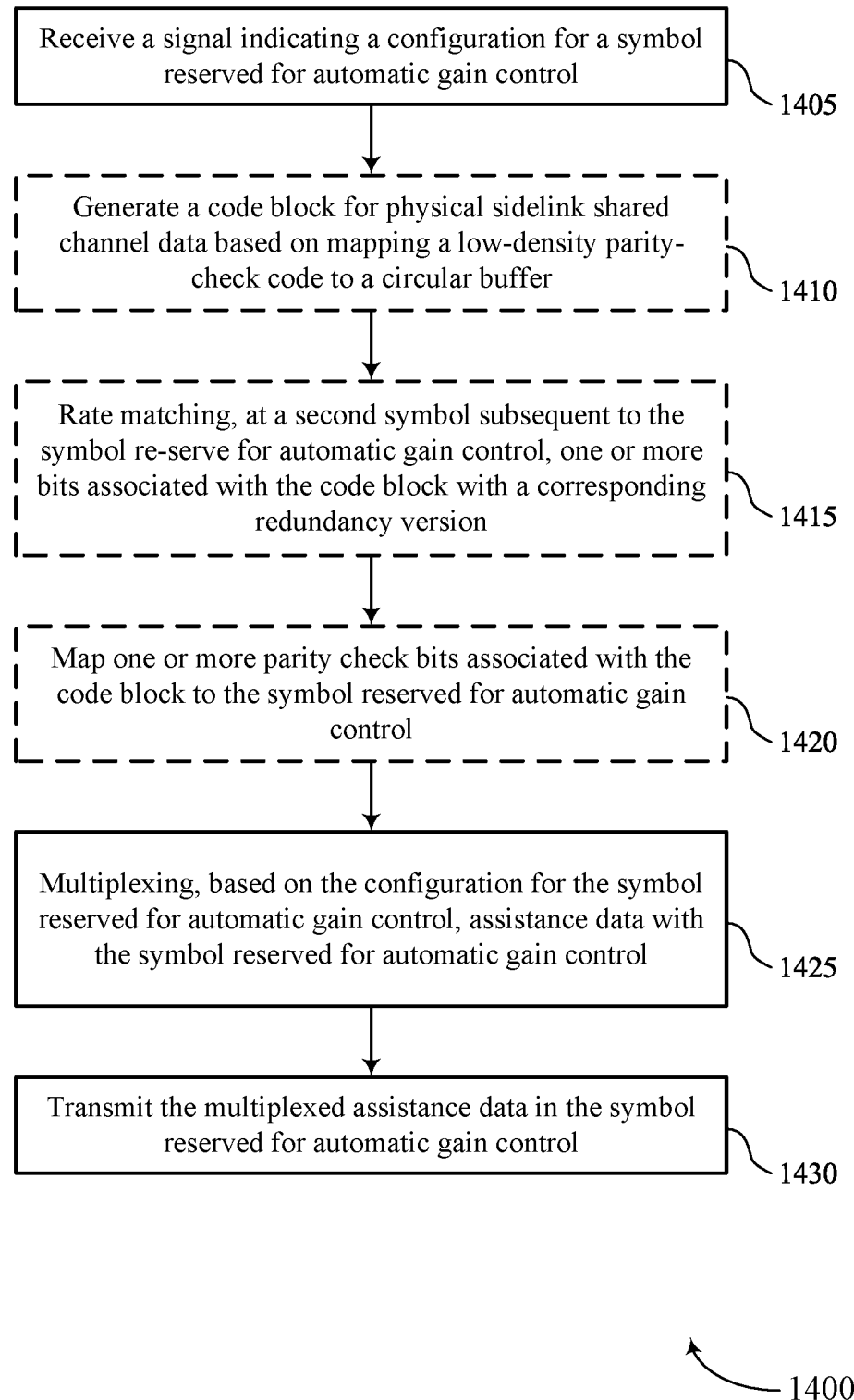

FIG. 14 shows a flowchart illustrating a method 1400 that supports rate matching on sidelink automatic gain control in accordance with one or more aspects of the present disclosure. The operations of the method 1400 may be implemented by a UE or its components as described herein. For example, the operations of the method 1400 may be performed by a UE 115 as described with reference to FIGS. 1 through 8. In some examples, a UE may execute a set of instructions to control the functional elements of the UE to perform the described functions. Additionally or alternatively, the UE may perform aspects of the described functions using special-purpose hardware.

At 1405, the method may include receiving a signal indicating a configuration for a symbol reserved for automatic gain control. The operations of 1405 may be performed in accordance with examples as disclosed herein. In some examples, aspects of the operations of 1405 may be performed by a configuration component 725 as described with reference to FIG. 7.

At 1410, the method may optionally include generating a code block for physical sidelink shared channel data based on mapping a low-density parity-check code to a circular buffer. The operations of 1410 may be performed in accordance with examples as disclosed herein. In some examples, aspects of the operations of 1410 may be performed by a code block generation component 740 as described with reference to FIG. 7.

At 1415, the method may optionally include rate matching, at a second symbol subsequent to the symbol reserved for automatic gain control, one or more bits associated with the code block with a corresponding redundancy version. The operations of 1415 may be performed in accordance with examples as disclosed herein. In some examples, aspects of the operations of 1415 may be performed by a rate matching component 745 as described with reference to FIG. 7.

At 1420, the method may optionally include mapping one or more parity check bits associated with the code block to the symbol reserved for automatic gain control. The operations of 1420 may be performed in accordance with examples as disclosed herein. In some examples, aspects of the operations of 1420 may be performed by a mapping component 750 as described with reference to FIG. 7.

At 1425, the method may include multiplexing, based on the configuration for the symbol reserved for automatic gain control, assistance data with the symbol reserved for automatic gain control. The operations of 1425 may be performed in accordance with examples as disclosed herein. In some examples, aspects of the operations of 1425 may be performed by a multiplexing component 730 as described with reference to FIG. 7.

At 1430, the method may include transmitting the multiplexed assistance data in the symbol reserved for automatic gain control. The operations of 1430 may be performed in accordance with examples as disclosed herein. In some examples, aspects of the operations of 1430 may be performed by an assistance data transmission component 735 as described with reference to FIG. 7.

Figure 15:
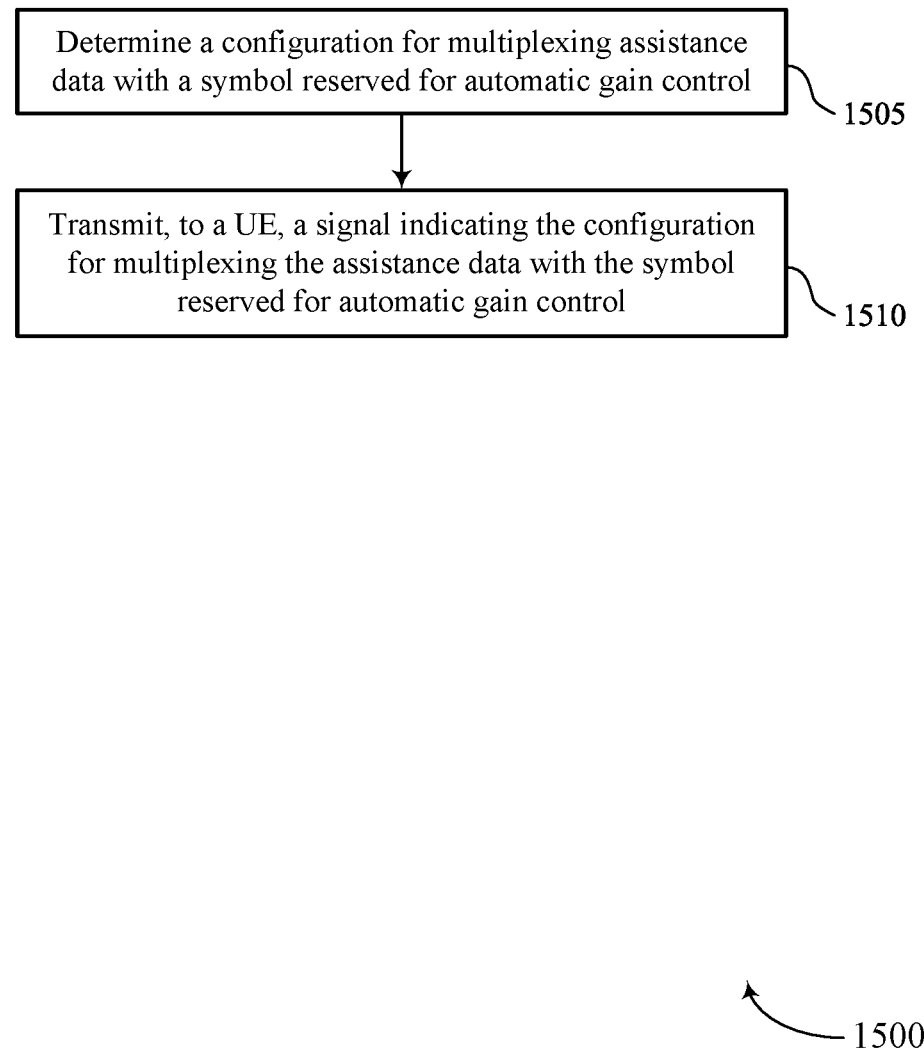

FIG. 15 shows a flowchart illustrating a method 1500 that supports rate matching on sidelink automatic gain control in accordance with one or more aspects of the present disclosure. The operations of the method 1500 may be implemented by a base station or its components as described herein. For example, the operations of the method 1500 may be performed by a base station 105 as described with reference to FIGS. 1 through 4 and 9 through 12. In some examples, a base station may execute a set of instructions to control the functional elements of the base station to perform the described functions. Additionally or alternatively, the base station may perform aspects of the described functions using special-purpose hardware.

At 1505, the method may include determining a configuration for multiplexing assistance data with a symbol reserved for automatic gain control. The operations of 1505 may be performed in accordance with examples as disclosed herein. In some examples, aspects of the operations of 1505 may be performed by a configuration determination component 1125 as described with reference to FIG. 11.

At 1510, the method may include transmitting, to a UE, a signal indicating the configuration for multiplexing the assistance data with the symbol reserved for automatic gain control. The operations of 1510 may be performed in accordance with examples as disclosed herein. In some examples, aspects of the operations of 1510 may be performed by a configuration transmission component 1130 as described with reference to FIG. 11.

Figure 16:
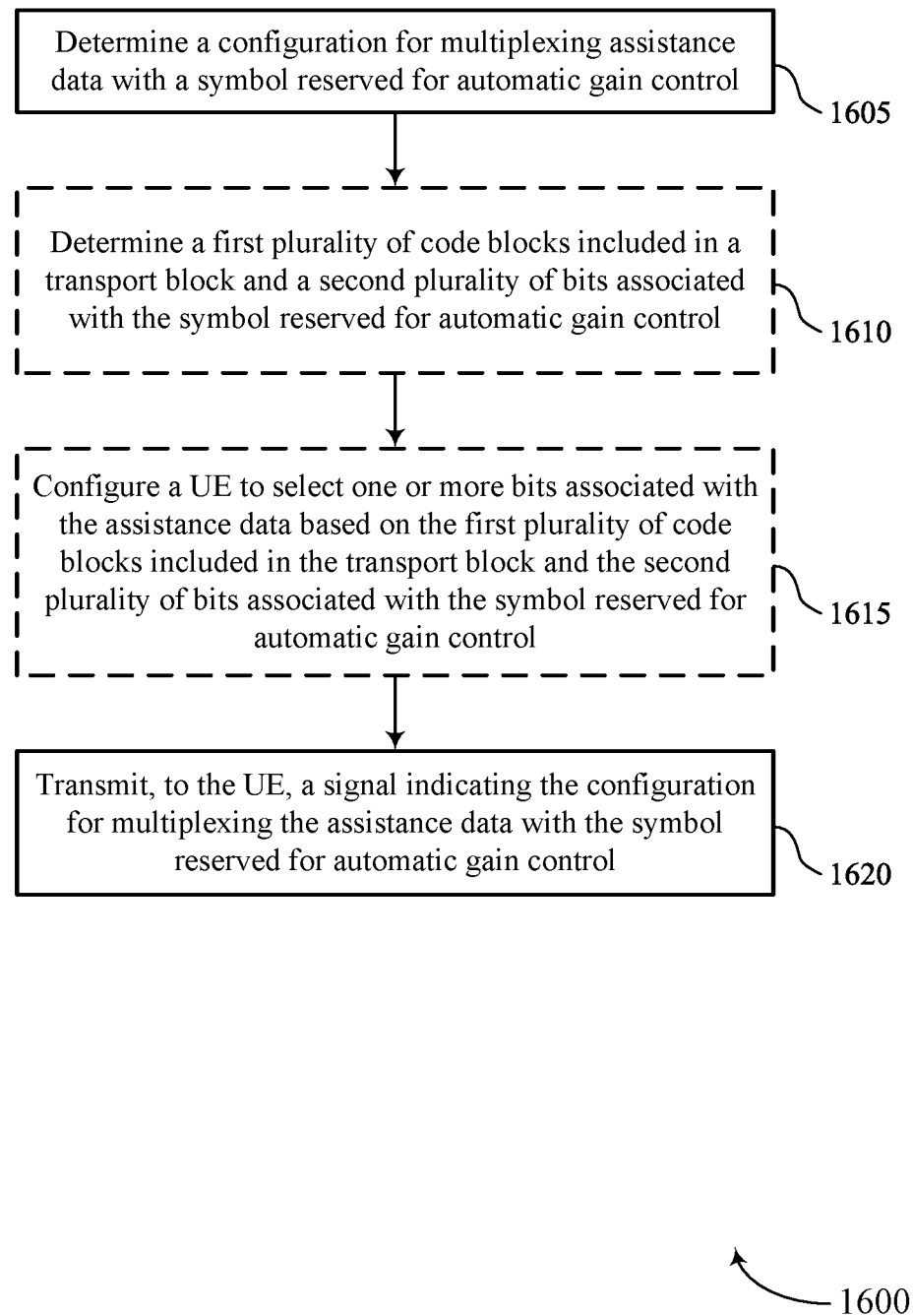

FIG. 16 shows a flowchart illustrating a method 1600 that supports rate matching on sidelink automatic gain control in accordance with one or more aspects of the present disclosure. The operations of the method 1600 may be implemented by a base station or its components as described herein. For example, the operations of the method 1600 may be performed by a base station 105 as described with reference to FIGS. 1 through 4 and 9 through 12. In some examples, a base station may execute a set of instructions to control the functional elements of the base station to perform the described functions. Additionally or alternatively, the base station may perform aspects of the described functions using special-purpose hardware.

At 1605, the method may include determining a configuration for multiplexing assistance data with a symbol reserved for automatic gain control. The operations of 1605 may be performed in accordance with examples as disclosed herein. In some examples, aspects of the operations of 1605 may be performed by a configuration determination component 1125 as described with reference to FIG. 11.

At 1610, the method may optionally include determining a first set of multiple code blocks included in a transport block and a second set of multiple bits associated with the symbol reserved for automatic gain control. The operations of 1610 may be performed in accordance with examples as disclosed herein. In some examples, aspects of the operations of 1610 may be performed by a code block component 1135 as described with reference to FIG. 11.

At 1615, the method may optionally include configuring a UE to select one or more bits associated with the assistance data based on the first set of multiple code blocks included in the transport block and the second set of multiple bits associated with the symbol reserved for automatic gain control. The operations of 1615 may be performed in accordance with examples as disclosed herein. In some examples, aspects of the operations of 1615 may be performed by a bit selection component 1140 as described with reference to FIG. 11.

At 1620, the method may include transmitting, to the UE, a signal indicating the configuration for multiplexing the assistance data with the symbol reserved for automatic gain control. The operations of 1620 may be performed in accordance with examples as disclosed herein. In some examples, aspects of the operations of 1620 may be performed by a configuration transmission component 1130 as described with reference to FIG. 11.

The following provides an overview of aspects of the present disclosure:

Aspect 1: A method for wireless communication at a UE, comprising: receiving a signal indicating a configuration for a symbol reserved for automatic gain control; multiplexing, based at least in part on the configuration for the symbol reserved for automatic gain control, assistance data with the symbol reserved for automatic gain control; and transmitting the multiplexed assistance data in the symbol reserved for automatic gain control.

Aspect 2: The method of aspect 1, wherein the multiplexing comprising multiplexing, based at least in part on the configuration for the symbol reserved for automatic gain control, physical sidelink shared channel data with the symbol reserved for automatic gain control.

Aspect 3: The method of any of aspects 1 through 2, wherein the multiplexing comprising multiplexing, based at least in part on the configuration for the symbol reserved for automatic gain control, physical sidelink control channel data with the symbol reserved for automatic gain control.

Aspect 4: The method of any of aspects 1 through 3, wherein the multiplexing comprising multiplexing, based at least in part on the configuration for the symbol reserved for automatic gain control, physical sidelink shared channel data and physical sidelink control channel data with the symbol reserved for automatic gain control.

Aspect 5: The method of any of aspects 1 through 4, further comprising: generating a code block for physical sidelink shared channel data based at least in part on mapping a low-density parity-check code to a circular buffer; rate matching, at a second symbol subsequent to the symbol reserved for automatic gain control, one or more bits associated with the code block with a corresponding redundancy version; and mapping one or more parity check bits associated with the code block to the symbol reserved for automatic gain control.

Aspect 6: The method of any of aspects 1 through 5, further comprising: generating a code block for physical sidelink control channel data based at least in part on a polar code; rate matching, at a second symbol subsequent to the symbol reserved for automatic gain control, one or more bits associated with the code block; and mapping one or more parity check bits associated with the code block to the symbol reserved for automatic gain control.

Aspect 7: The method of aspect 6, wherein a size of the code block is based at least in part on a size of a sidelink control information resource and a size of an automatic gain control resource.

Aspect 8: The method of any of aspects 1 through 7, further comprising: determining a first plurality of code blocks included in a transport block and a second plurality of bits associated with the symbol reserved for automatic gain control; and selecting one or more bits associated with the assistance data based at least in part on the first plurality of code blocks included in the transport block and the second plurality of bits associated with the symbol reserved for automatic gain control.

Aspect 9: The method of aspect 8, wherein the selecting comprising selecting an equal number of bits for each code block of the first plurality of code blocks; and mapping a remaining number of bits to the symbol reserved for automatic gain control.

Aspect 10: The method of any of aspects 8 through 9, wherein the selecting comprising selecting one or more bits associated with the assistance data based at least in part on a code block associated with the one or more bits and a demodulation reference signal.

Aspect 11: The method of any of aspects 8 through 10, wherein the selecting comprising selecting one or more bits associated with the assistance data based at least in part on a priority of a code block associated with the one or more bits.

Aspect 12: The method of aspect 11, wherein the code block is associated with an uplink control information, a MAC control element, or both.

Aspect 13: The method of any of aspects 1 through 12, further comprising: selecting one or more bits associated with the assistance data based at least in part on a plurality of code blocks, wherein the one or more bits are selected uniformly or non-uniformly for the plurality of code blocks.

Aspect 14: The method of aspect 13, further comprising: transmitting an indication of selection of the plurality of code blocks based at least in part on selecting the one or more bits associated with the assistance data.

Aspect 15: The method of aspect 14, wherein the indication of the selection comprises an indication of uniform selection, an indication of non-uniform selection, or both.

Aspect 16: The method of any of aspects 14 through 15, wherein the indication of the selection comprises at least one of a first sidelink control information format, a second sidelink control information format, a MAC control element, a radio resource control, or a combination thereof.

Aspect 17: The method of any of aspects 13 through 16, further comprising: receiving a request to increase reliability associated with the plurality of code blocks, wherein selecting the one or more bits associated with the assistance data is based at least in part on the request.

Aspect 18: The method of any of aspects 1 through 17, wherein the assistance data comprises at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

Aspect 19: A method for wireless communication at a base station, comprising: determining a configuration for multiplexing assistance data with a symbol reserved for automatic gain control; and transmitting, to a UE, a signal indicating the configuration for multiplexing the assistance data with the symbol reserved for automatic gain control.

Aspect 20: The method of aspect 19, wherein the determining comprising determining the configuration for multiplexing physical sidelink shared channel data with the symbol reserved for automatic gain control.

Aspect 21: The method of any of aspects 19 through 20, wherein the determining comprising determining the configuration for multiplexing physical sidelink control channel data with the symbol reserved for automatic gain control.

Aspect 22: The method of any of aspects 19 through 21, wherein the determining comprising determining the configuration for multiplexing physical sidelink shared channel data and physical sidelink control channel data with the symbol reserved for automatic gain control.

Aspect 23: The method of any of aspects 19 through 22, further comprising: determining a first plurality of code blocks included in a transport block and a second plurality of bits associated with the symbol reserved for automatic gain control; and configuring the UE to select one or more bits associated with the assistance data based at least in part on the first plurality of code blocks included in the transport block and the second plurality of bits associated with the symbol reserved for automatic gain control.

Aspect 24: The method of aspect 23, wherein the configuring comprising configuring the UE to select an equal number of bits for each code block of the first plurality of code blocks; and configuring the UE to map a remaining number of bits to the symbol reserved for automatic gain control.

Aspect 25: The method of any of aspects 23 through 24, wherein the configuring comprising configuring the UE to select one or more bits associated with the assistance data based at least in part on a code block associated with the one or more bits and a demodulation reference signal.

Aspect 26: The method of any of aspects 23 through 25, wherein the configuring comprising configuring the UE to select one or more bits associated with the assistance data based at least in part on a priority of a code block associated with the one or more bits.

Aspect 27: The method of aspect 26, wherein the code block is associated with an uplink control information, a MAC control element, or both.

Aspect 28: The method of any of aspects 19 through 27, wherein the assistance data comprises at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

Aspect 29: An apparatus for wireless communication at a UE, comprising a processor; and memory coupled to the processor; and the processor and memory configured to perform a method of any of aspects 1 through 18.

Aspect 30: An apparatus for wireless communication at a UE, comprising at least one means for performing a method of any of aspects 1 through 18.

Aspect 31: A non-transitory computer-readable medium storing code for wireless communication at a UE, the code comprising instructions executable by a processor to perform a method of any of aspects 1 through 18.

Aspect 32: An apparatus for wireless communication at a base station, comprising a processor; and memory coupled to the processor; and the processor and memory configured to perform a method of any of aspects 19 through 28.

Aspect 33: An apparatus for wireless communication at a base station, comprising at least one means for performing a method of any of aspects 19 through 28.

Aspect 34: A non-transitory computer-readable medium storing code for wireless communication at a base station, the code comprising instructions executable by a processor to perform a method of any of aspects 19 through 28.

It should be noted that the methods described herein describe possible implementations, and that the operations and the operations may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example operation that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A user equipment (UE), comprising:
one or more memories storing processor-executable code; and
one or more processors coupled with the one or more memories configured to cause the UE to:
receive a signal indicating a configuration for a symbol reserved for automatic gain control;
multiplex, based at least in part on the configuration for the symbol reserved for automatic gain control, assistance data with the symbol reserved for automatic gain control; and
transmit the multiplexed assistance data in the symbol reserved for automatic gain control.

2. The UE of claim 1, wherein, to multiplex, the one or more processors configured to cause the UE to:
multiplex, based at least in part on the configuration for the symbol reserved for automatic gain control, physical sidelink shared channel data with the symbol reserved for automatic gain control.

3. The UE of claim 1, wherein, to multiplex, the one or more processors are configured to cause the UE to:
multiplex, based at least in part on the configuration for the symbol reserved for automatic gain control, physical sidelink control channel data with the symbol reserved for automatic gain control.

4. The UE of claim 1, wherein, to multiplex, the one or more processors are configured to cause the UE to:
multiplex, based at least in part on the configuration for the symbol reserved for automatic gain control, physical sidelink shared channel data and physical sidelink control channel data with the symbol reserved for automatic gain control.

5. The apparatus of claim 1, wherein the one or more processors are configured to cause the UE to:
generate a code block for physical sidelink shared channel data based at least in part on mapping a low-density parity-check code to a circular buffer;
rate match, at a second symbol subsequent to the symbol reserved for automatic gain control, one or more bits associated with the code block with a corresponding redundancy version; and
map one or more parity check bits associated with the code block to the symbol reserved for automatic gain control.

6. The UE of claim 1, wherein the one or more processors are configured to cause the UE to:
generate a code block for physical sidelink control channel data based at least in part on a polar code;
rate match, at a second symbol subsequent to the symbol reserved for automatic gain control, one or more bits associated with the code block; and
map one or more parity check bits associated with the code block to the symbol reserved for automatic gain control.

7. The UE of claim 6, wherein a size of the code block is based at least in part on a size of a sidelink control information resource and a size of an automatic gain control resource.

8. The UE of claim 1, wherein the one or more processors are configured to cause the UE to:
determine a first plurality of code blocks included in a transport block and a second plurality of bits associated with the symbol reserved for automatic gain control; and
select one or more bits associated with the assistance data based at least in part on the first plurality of code blocks included in the transport block and the second plurality of bits associated with the symbol reserved for automatic gain control.

9. The UE of claim 8, wherein, to select, the one or more processors are configured to cause the UE to:
select an equal number of bits for each code block of the first plurality of code blocks; and
map a remaining number of bits to the symbol reserved for automatic gain control.

10. The UE of claim 8, wherein, to select, the one or more processors are configured to cause the UE to:
select one or more bits associated with the assistance data based at least in part on a code block associated with the one or more bits and a demodulation reference signal.

11. The UE of claim 8, wherein, to select, the one or more processors are configured to cause the UE to:
select one or more bits associated with the assistance data based at least in part on a priority of a code block associated with the one or more bits.

12. The UE of claim 11, wherein the code block is associated with an uplink control information or a medium access control (MAC) control element or both.

13. The apparatus of claim 1, wherein the one or more processors are configured to cause the UE to:
select one or more bits associated with the assistance data based at least in part on a plurality of code blocks, wherein the one or more bits are selected uniformly or non-uniformly for the plurality of code blocks.

14. The UE of claim 13 further comprising an antenna panel, wherein the one or more processors are configured to cause the UE to:
transmit an indication of selection of the plurality of code blocks based at least in part on selecting the one or more bits associated with the assistance data.

15. The UE of claim 14, wherein the indication of the selection comprises an indication of uniform selection or an indication of non-uniform selection or both.

16. The UE of claim 14, wherein the indication of the selection comprises at least one of a first sidelink control information format, a second sidelink control information format, a medium access control (MAC) control element, a radio resource control, or a combination thereof.

17. The UE of claim 13, wherein the one or more processors are configured to cause the UE to:
receive a request to increase reliability associated with the plurality of code blocks, wherein selecting the one or more bits associated with the assistance data is based at least in part on the request.

18. The UE of claim 1, wherein the assistance data comprises at least one of parity check bits associated with a physical sidelink control channel, parity check bits associated with a physical sidelink shared channel, parity check bits associated with the physical sidelink control channel and the physical sidelink shared channel, an inter-UE coordination message, a feedback code book, a tracking reference signal, a channel state information report, or a combination thereof.

19. A network entity, comprising:
one or more memories storing processor-executable code; and one or more processors coupled with the one or more memories configured to cause the network entity to:
  determine a configuration for multiplexing assistance data with a symbol reserved for automatic gain control; and
  transmit, to a user equipment (UE), a signal indicating the configuration for multiplexing the assistance data with the symbol reserved for automatic gain control.

20. The network entity of claim 19, wherein, to determine, the one or more processors configured to cause the network entity to:
  determine the configuration for multiplexing physical sidelink shared channel data with the symbol reserved for automatic gain control.

21. The network entity of claim 19, wherein, to determine, the one or more are configured to cause the network entity to:
  determine the configuration for multiplexing physical sidelink control channel data with the symbol reserved for automatic gain control.

22. The network entity of claim 19, wherein, to determine, the one or more processors are configured to cause the network entity to:
  determine the configuration for multiplexing physical sidelink shared channel data and physical sidelink control channel data with the symbol reserved for automatic gain control.

23. The network entity of claim 19, wherein the one or more processors are configured to cause the network entity to:
  determine a first plurality of code blocks included in a transport block and a second plurality of bits associated with the symbol reserved for automatic gain control; and
  configure the UE to select one or more bits associated with the assistance data based at least in part on the first plurality of code blocks included in the transport block and the second plurality of bits associated with the symbol reserved for automatic gain control.

24. The network entity of claim 23, wherein, to configure, the one or more processors are configured to cause the network entity to:
  configure the UE to select an equal number of bits for each code block of the first plurality of code blocks; and
  configure the UE to map a remaining number of bits to the symbol reserved for automatic gain control.

25. The network entity of claim 23, further comprising an antenna panel, wherein the one or more processors are configured to cause the network entity to:
  configure the UE to select one or more bits associated with the assistance data based at least in part on a code block associated with the one or more bits and a demodulation reference signal.

26. The network entity of claim 23, wherein, to configure, the one or more processors are configured to cause the network entity to:
  configure the UE to select one or more bits associated with the assistance data based at least in part on a priority of a code block associated with the one or more bits.

27. The network entity of claim 26, wherein the code block is associated with an uplink control information or a medium access control (MAC) control element or both.

28. The network entity of claim 19, wherein the assistance data comprises at least one of parity check bits associated with a physical sidelink control channel, parity check bits associated with a physical sidelink shared channel, parity check bits associated with the physical sidelink control channel and the physical sidelink shared channel, an inter-UE co-ordination message, a feedback code book, a tracking reference signal, a channel state information report, or a combination thereof.

29. A method for wireless communication at a user equipment (UE), comprising:
  receiving a signal indicating a configuration for a symbol reserved for automatic gain control;
  multiplexing, based at least in part on the configuration for the symbol reserved for automatic gain control, assistance data with the symbol reserved for automatic gain control; and
  transmitting the multiplexed assistance data in the symbol reserved for automatic gain control.

30. The method of claim 29, the multiplexing comprising:
  multiplexing, based at least in part on the configuration for the symbol reserved for automatic gain control, physical sidelink shared channel data with the symbol reserved for automatic gain control.

31. The method of claim 29, the multiplexing comprising:
  multiplexing, based at least in part on the configuration for the symbol reserved for automatic gain control, physical sidelink control channel data with the symbol reserved for automatic gain control.

32. The method of claim 29, the multiplexing comprising:
  multiplexing, based at least in part on the configuration for the symbol reserved for automatic gain control, physical sidelink shared channel data and physical sidelink control channel data with the symbol reserved for automatic gain control.

33. The method of claim 29, further comprising:
  generating a code block for physical sidelink shared channel data based at least in part on mapping a low-density parity-check code to a circular buffer;
  rate matching, at a second symbol subsequent to the symbol reserved for automatic gain control, one or more bits associated with the code block with a corresponding redundancy version; and
  mapping one or more parity check bits associated with the code block to the symbol reserved for automatic gain control.

34. The method of claim 29, further comprising:
  generating a code block for physical sidelink control channel data based at least in part on a polar code;
  rate matching, at a second symbol subsequent to the symbol reserved for automatic gain control, one or more bits associated with the code block; and
  mapping one or more parity check bits associated with the code block to the symbol reserved for automatic gain control.

35. The method of claim 29, further comprising:
  determining a first plurality of code blocks included in a transport block and a second plurality of bits associated with the symbol reserved for automatic gain control; and
  selecting one or more bits associated with the assistance data based at least in part on the first plurality of code blocks included in the transport block and the second plurality of bits associated with the symbol reserved for automatic gain control.

36. The method of claim 29, further comprising:
  selecting one or more bits associated with the assistance data based at least in part on a plurality of code blocks, wherein the one or more bits are selected uniformly or non-uniformly for the plurality of code blocks.

37. A method for wireless communication at a base station, comprising:
- determining a configuration for multiplexing assistance data with a symbol reserved for automatic gain control; and
- transmitting, to a user equipment (UE), a signal indicating the configuration for multiplexing the assistance data with the symbol reserved for automatic gain control.

38. The method of claim 37, the determining comprising:
- determining the configuration for multiplexing physical sidelink shared channel data with the symbol reserved for automatic gain control.

39. The method of claim 37, the determining comprising:
- determining the configuration for multiplexing physical sidelink control channel data with the symbol reserved for automatic gain control.

40. The method of claim 37, the determining comprising:
- determining the configuration for multiplexing physical sidelink shared channel data and physical sidelink control channel data with the symbol reserved for automatic gain control.

41. The method of claim 37, further comprising:
- determining a first plurality of code blocks included in a transport block and a second plurality of bits associated with the symbol reserved for automatic gain control; and
- configuring the UE to select one or more bits associated with the assistance data based at least in part on the first plurality of code blocks included in the transport block and the second plurality of bits associated with the symbol reserved for automatic gain control.

42. The method of claim 41, the configuring comprising:
- configuring the UE to select an equal number of bits for each code block of the first plurality of code blocks; and
- configuring the UE to map a remaining number of bits to the symbol reserved for automatic gain control.

43. A non-transitory computer-readable medium storing code for wireless communications at a user equipment (UE), the code comprising instructions executable by one or more processors to cause the UE to:
- receive a signal indicating a configuration for a symbol reserved for automatic gain control;
- multiplex, based at least in part on the configuration for the symbol reserved for automatic gain control, assistance data with the symbol reserved for automatic gain control; and
- transmit the multiplexed assistance data in the symbol reserved for automatic gain control.

44. A non-transitory computer-readable medium storing code for wireless communications at a network entity, the code comprising instructions executable by one or more processors to cause the network entity to:
- determine a configuration for multiplexing assistance data with a symbol reserved for automatic gain control; and
- transmit, to a user equipment (UE), a signal indicating the configuration for multiplexing the assistance data with the symbol reserved for automatic gain control.

\* \* \* \* \*